(12) United States Patent
Harada et al.

(10) Patent No.: US 11,508,292 B2
(45) Date of Patent: Nov. 22, 2022

(54) DISPLAY DEVICE

(71) Applicant: Japan Display Inc., Tokyo (JP)

(72) Inventors: Tsutomu Harada, Tokyo (JP);
Tadafumi Ozaki, Tokyo (JP);
Kazunari Tomizawa, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 17/407,344

(22) Filed: Aug. 20, 2021

(65) Prior Publication Data
US 2021/0383744 A1     Dec. 9, 2021

Related U.S. Application Data

(63) Continuation of application No. PCT/JP2019/045329, filed on Nov. 19, 2019.

(30) Foreign Application Priority Data

Feb. 20, 2019     (JP) .............................. JP2019-028330

(51) Int. Cl.
*G09G 3/32*     (2016.01)
*H01L 27/15*     (2006.01)

(52) U.S. Cl.
CPC ............. *G09G 3/32* (2013.01); *H01L 27/156* (2013.01); *G09G 2300/0426* (2013.01); *G09G 2300/0819* (2013.01); *G09G 2300/0842* (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 2004/0036664 A1 | 2/2004 | Miyazawa | |
| 2007/0210993 A1* | 9/2007 | Murakata | G09G 3/2022 345/76 |
| 2007/0229413 A1* | 10/2007 | Hara | G09G 3/3266 345/76 |

(Continued)

FOREIGN PATENT DOCUMENTS

| | | |
|---|---|---|
| JP | 2004-70293 A | 3/2004 |
| JP | 2007-293264 A | 11/2007 |

(Continued)

OTHER PUBLICATIONS

International Search Report and Written Opinion dated Feb. 18, 2020, received for PCT Application PCT/JP2019/045329, Filed on Nov. 19, 2019, 10 pages including English Translation.

*Primary Examiner* — Nitin Patel
*Assistant Examiner* — Amen W Bogale
(74) *Attorney, Agent, or Firm* — Xsensus LLP

(57) ABSTRACT

According to one embodiment, a display device includes a first power supply line, a second power supply line, a reset line, pixels, gate lines, control wiring lines, source lines, a first driver and a second driver. Each of the pixels includes a drive transistor, a light emitting element, a pixel switch, a storage capacitor and a reset switch. The reset switch is connected between the reset line and a gate electrode of the drive transistor, and switched between an ON state and an OFF state by a second control signal provided via a corresponding control wiring line among the control wiring lines.

8 Claims, 15 Drawing Sheets

(56) References Cited

U.S. PATENT DOCUMENTS

| | | | |
|---|---|---|---|
| 2013/0229405 A1* | 9/2013 | Ono | ............... G09G 3/3233 345/212 |
| 2015/0138253 A1 | 5/2015 | Kimura et al. | |
| 2018/0019233 A1 | 1/2018 | Chang et al. | |
| 2018/0197934 A1* | 7/2018 | Chen | ............... H01L 27/3262 |
| 2018/0204889 A1 | 7/2018 | Yu et al. | |
| 2019/0279590 A1 | 9/2019 | Takahashi | |

FOREIGN PATENT DOCUMENTS

| | | |
|---|---|---|
| JP | 2015-96906 A | 5/2015 |
| JP | 2018-14475 A | 1/2018 |
| JP | 2018-97363 A | 6/2018 |
| JP | 2018-534613 A | 11/2018 |

\* cited by examiner

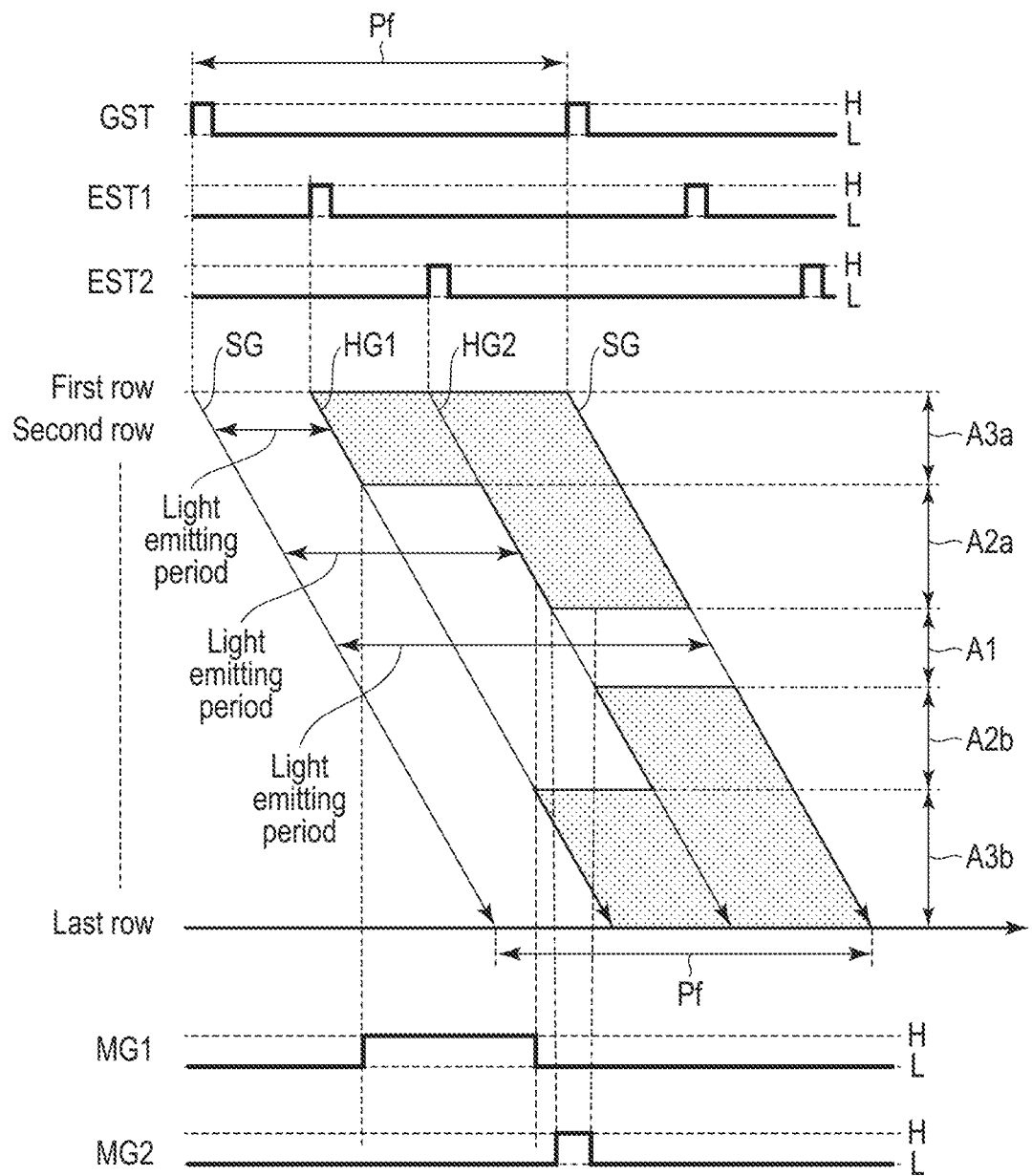
F I G. 12

DISPLAY DEVICE

CROSS-REFERENCE TO RELATED APPLICATIONS

This application is a Continuation Application of PCT Application No. PCT/JP2019/045329, filed Nov. 19, 2019 and based upon and claiming the benefit of priority from Japanese Patent Application No. 2019-028330, filed Feb. 20, 2019, the entire contents of all of which are incorporated herein by reference.

FIELD

Embodiments described herein relate generally to a display device.

BACKGROUND

As a display device, a light emitting diode (LED) display device using an LED which is a self-light emitting element is known. In recent years, as a higher-definition display device, a display device in which minute light emitting diodes called micro LEDs are mounted on an array substrate (hereinafter, referred to as a micro LED display device) has been developed.

Unlike the conventional liquid crystal display device or organic electroluminescence (EL) display device, the micro LED display device is formed by mounting a large number of chip-shaped micro LEDs in a display area, therefore, the micro LED display device easily achieves both high definition and large size and has attracted attention as a next-generation display device.

BRIEF DESCRIPTION OF THE DRAWINGS

FIG. 6 is a circuit diagram showing a part of a gate driver and some gate lines shown in FIG. 5 and the like.

FIG. 7 is a circuit diagram showing a part of an erase driver and some control wiring lines shown in FIG. 5 and the like.

FIG. 12 is a timing chart showing an example of a display operation of the display device according to the second embodiment.

DETAILED DESCRIPTION

Figure 1:
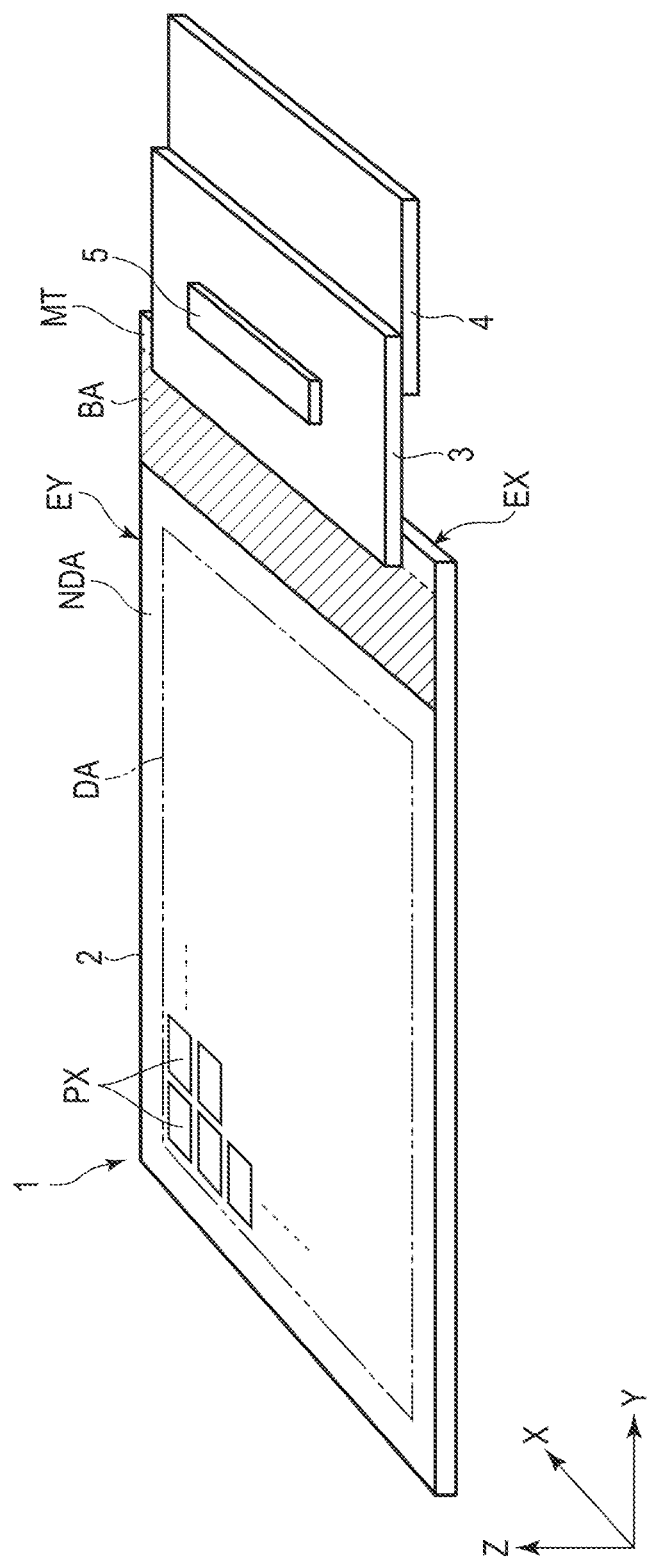
FIG. 1 is a perspective view showing a configuration of a display device according to a first embodiment.

In general, according to one embodiment, there is provided a display device comprising: a first power supply line; a second power supply line; a reset line; a plurality of pixels arranged in a row direction and a column direction; a plurality of gate lines, each of the gate lines being shared by the plurality of pixels arranged in the row direction; a plurality of control wiring lines, each of the control wiring lines being shared by the plurality of pixels arranged in the row direction; a plurality of source lines, each of the source lines being shared by the plurality of pixels arranged in the column direction; a first driver that provides a first control signal to the plurality of gate lines; and a second driver that provides a second control signal to the plurality of control wiring lines. Each of the pixels includes: a drive transistor and a light emitting element connected in series between the first power supply line and the second power supply line; a pixel switch connected between a corresponding source line among the plurality of source lines and a gate electrode of the drive transistor, the pixel switch being switched between an ON state and an OFF state by the first control signal provided via a corresponding gate line among the plurality of gate lines; a storage capacitor connected to the gate electrode; and a reset switch connected between the reset line and the gate electrode, the reset switch being switched between an ON state and an OFF state by the second control signal provided via a corresponding control wiring line among the plurality of control wiring lines.

According to another embodiment, there is provided a display device comprising: a first power supply line; a second power supply line; a reset line; a plurality of pixels arranged in a row direction and a column direction; a plurality of gate lines, each of the gate lines being shared by the plurality of pixels arranged in the row direction; a plurality of source lines, each of the source lines being shared by the plurality of pixels arranged in the column direction; and a first driver that provides a first control signal and a second control signal to the plurality of gate lines. Each of the pixels includes: a drive transistor and a light emitting element connected in series between the first power supply line and the second power supply line; a pixel switch connected between a corresponding source line among the plurality of source lines and a gate electrode of the drive transistor, the pixel switch being switched between an ON state and an OFF state by the first control signal or the second control signal provided via a corresponding gate line among the plurality of gate lines; and a storage capacitor connected to the gate electrode. The first driver includes a first circuit connected to the plurality of gate lines continuous in the column direction and a second circuit connected to the plurality of remaining gate lines continuous in the column direction. In an optional period, the first circuit provides one of the first control signal and the second control signal to a corresponding gate line, and the second circuit provides another of the first control signal and the second control signal to a corresponding gate line.

Embodiments will now be described with reference to accompanying drawings. Note that the disclosure is presented for the sake of exemplification, and any modification and variation conceived within the scope and spirit of the invention by a person having ordinary skill in the art are naturally encompassed in the scope of invention of the present application. Furthermore, a width, thickness, shape, and the like of each element are depicted schematically in the figures as compared to actual embodiments for the sake of simpler explanation, and they do not limit the interpretation of the invention of the present application. Furthermore, in the description and Figures of the present application, structural elements having the same or similar functions will be referred to by the same reference numbers and detailed explanations of them that are considered redundant may be omitted.

First Embodiment

First, a first embodiment will be described. FIG. 1 is a perspective view showing a configuration of a display device 1 according to the present embodiment. FIG. 1 shows a three-dimensional space defined by a first direction Y, a second direction Y perpendicular to the first direction X, and a third direction Z perpendicular to the first direction X and the second direction Y. The first direction X and the second direction Y are orthogonal to each other but may intersect at an angle other than 90°. In the present embodiment, the third direction Z is defined as upward, and the direction opposite to the third direction Z is defined as downward. In the case of "a second member on a first member" and "the second member under the first member", the second member may be in contact with the first member or may be located away from the first member.

Hereinafter, in the present embodiment, a description is mainly made of a case in which the display device 1 is a micro LED (Light Emitting Diode) display device using a micro light emitting diode (hereinafter, referred to as a micro LED) which is a self-light emitting element.

As shown in FIG. 1, the display device 1 includes a display panel 2, a first circuit substrate 3, a second circuit substrate 4, and the like.

In one example, the display panel 2 has a rectangular shape. In the illustrated example, a short side EX of the display panel 2 is parallel to the first direction X, and a long side EY of the display panel 2 is parallel to the second direction Y. The third direction Z corresponds to a thickness direction of the display panel 2. A main surface of the display panel 2 is parallel to an X-Y plane defined by the first direction X and the second direction Y. The display panel 2 includes a display area DA and a non-display area NDA outside the display area DA. The non-display area NDA has a terminal area MT. In the illustrated example, the non-display area NDA surrounds the display area DA.

The display area DA is an area for displaying an image, and includes a plurality of main pixels PX arranged in a matrix in the first direction X and the second direction Y. In the present embodiment, the first direction X is a row direction, and the second direction Y is a column direction.

The terminal area MT is provided along the short side EX of the display panel 2 and includes terminals for electrically connecting the display panel 2 to an external device or the like.

The first circuit substrate 3 is mounted on the terminal area MT and is electrically connected to the display panel 2. The first circuit substrate 3 is, for example, a flexible printed circuit. The first circuit substrate 3 includes a drive IC chip (hereinafter, referred to as a panel driver) 5 that drives the display panel 2. In the illustrated example, the panel driver 5 is arranged on the first circuit substrate 3 but may be arranged below the first circuit substrate 3. Alternatively, the panel driver 5 may be mounted on a location other than the first circuit substrate 3, and for example, may be mounted on the second circuit substrate 4. The second circuit substrate 4 is, for example, a flexible printed circuit. The second circuit substrate 4 is connected to the first circuit substrate 3, for example, below the first circuit substrate 3.

The panel driver 5 is connected to a control board (not shown) via the second circuit substrate 4, for example. The panel driver 5 performs control to display an image on the display panel 2 by driving the plurality of main pixels PX based on, for example, an image signal (for example, a video signal) output from the control board.

The display panel 2 may have a bent area BA indicated by hatching. The bent area BA is an area that is bent when the display device 1 is accommodated in a housing of an electronic device or the like. The bent area BA is located on the terminal area MT side of the non-display area NDA. In a state in which the bent area BA is bent, the first circuit substrate 3 and the second circuit substrate 4 are arranged below the display panel 2 so as to face the display panel 2.

Figure 2:
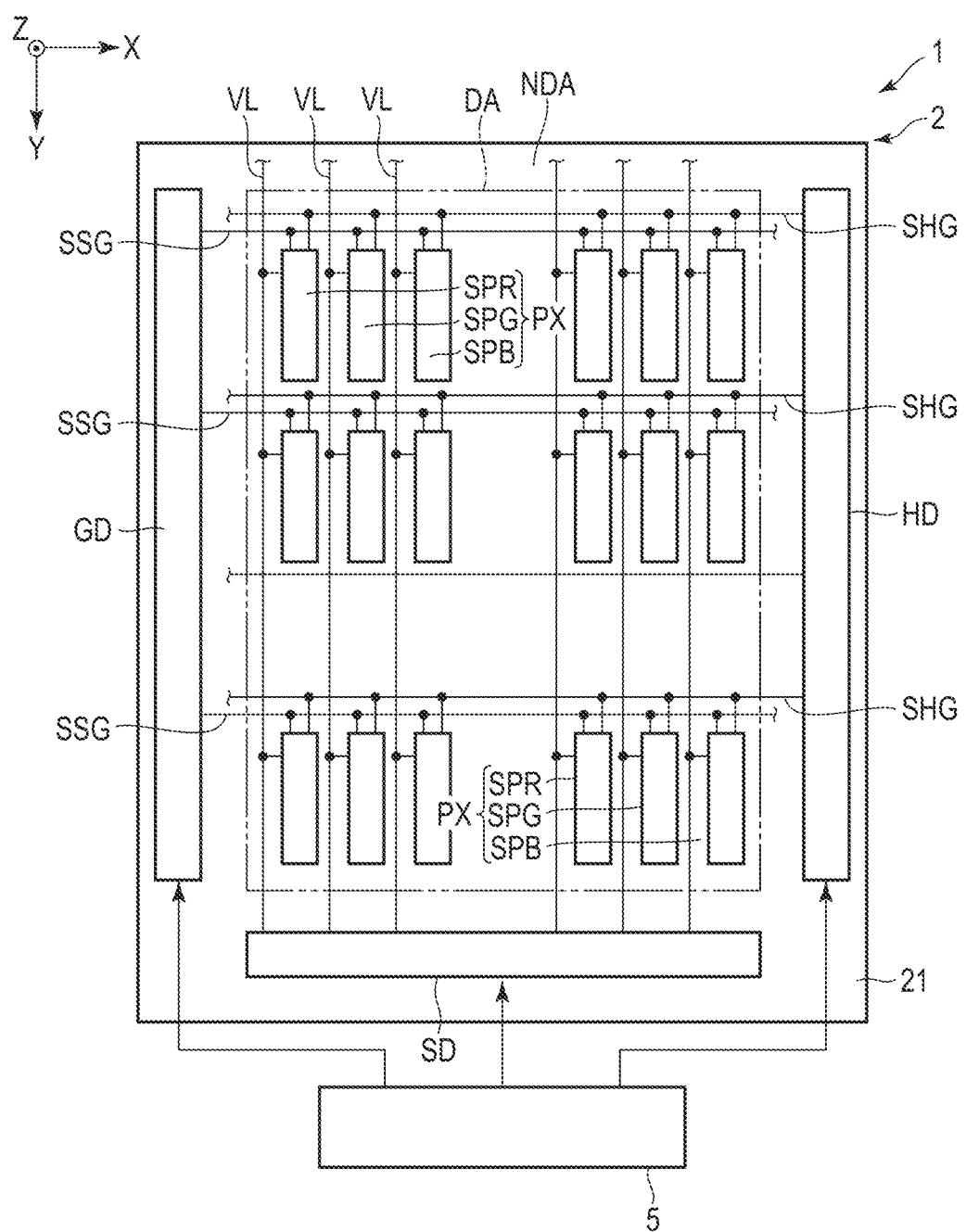
FIG. 2 is a plan view showing a circuit configuration of the display device.

FIG. 2 is a plan view showing a circuit configuration of the display device 1.

As shown in FIG. 2, the display device 1 includes the display panel 2 of an active matrix type. The display panel 2 includes an insulating substrate 21, the plurality of main pixels PX arranged on the insulating substrate 21, various wiring lines, a gate driver GD, an erase driver HD, and a source driver SD. In the present embodiment, the gate driver GD functions as a first driver, and the erase driver HD functions as a second driver.

Each of the main pixels PX includes a plurality of pixels SP. In the present embodiment, the main pixel PX includes three types of pixels: a first pixel SPR exhibiting a first color, a second pixel SPG exhibiting a second color, and a third pixel SPB exhibiting a third color. Here, the first color is red, the second color is green, and the third color is blue. The plurality of pixels SP are arranged in a matrix in the first direction X and the second direction Y in the display area DA.

The pixel SP includes a light emitting element (micro LED) and a pixel circuit for supplying a drive current to the light emitting element to drive the light emitting element. The pixel circuit includes a drive transistor and various switching elements to be described later. Here, in the present embodiment, the description is made using the terms of the main pixel PX and the pixel SP, but the main pixel PX can be rephrased as a pixel. In this case, the pixel SP is a sub-pixel.

The various wiring lines extend in the display area DA and are drawn out to the non-display area NDA. FIG. 2 exemplifies a plurality of gate lines SSG, a plurality of control wiring lines SHG, and a plurality of source lines VL as a part of the various wiring lines. Each gate line SSG is shared by the plurality of pixels SP arranged in the first direction X. Each control wiring line SHG is shared by the plurality of pixels SP arranged in the first direction X. Each source line VL is shared by the plurality of pixels SP arranged in the second direction Y.

The gate driver GD, the erase driver HD, and the source driver SD are located in the non-display area NDA. In the display area DA, the gate line SSG, the control wiring line SHG, and the source line VL are connected to the pixel SP. The gate line SSG is connected to the gate driver GD in the non-display area NDA. The control wiring line SHG is connected to the erase driver HD in the non-display area NDA. In the present embodiment, the gate driver GD and the erase driver HD sandwich the display area DA in the first direction X. The source line VL is connected to the source driver SD in non-display area NDA.

Various signals and voltages are supplied from the panel driver 5 to the gate driver GD, the erase driver HD, and the source driver SD.

Figure 3:
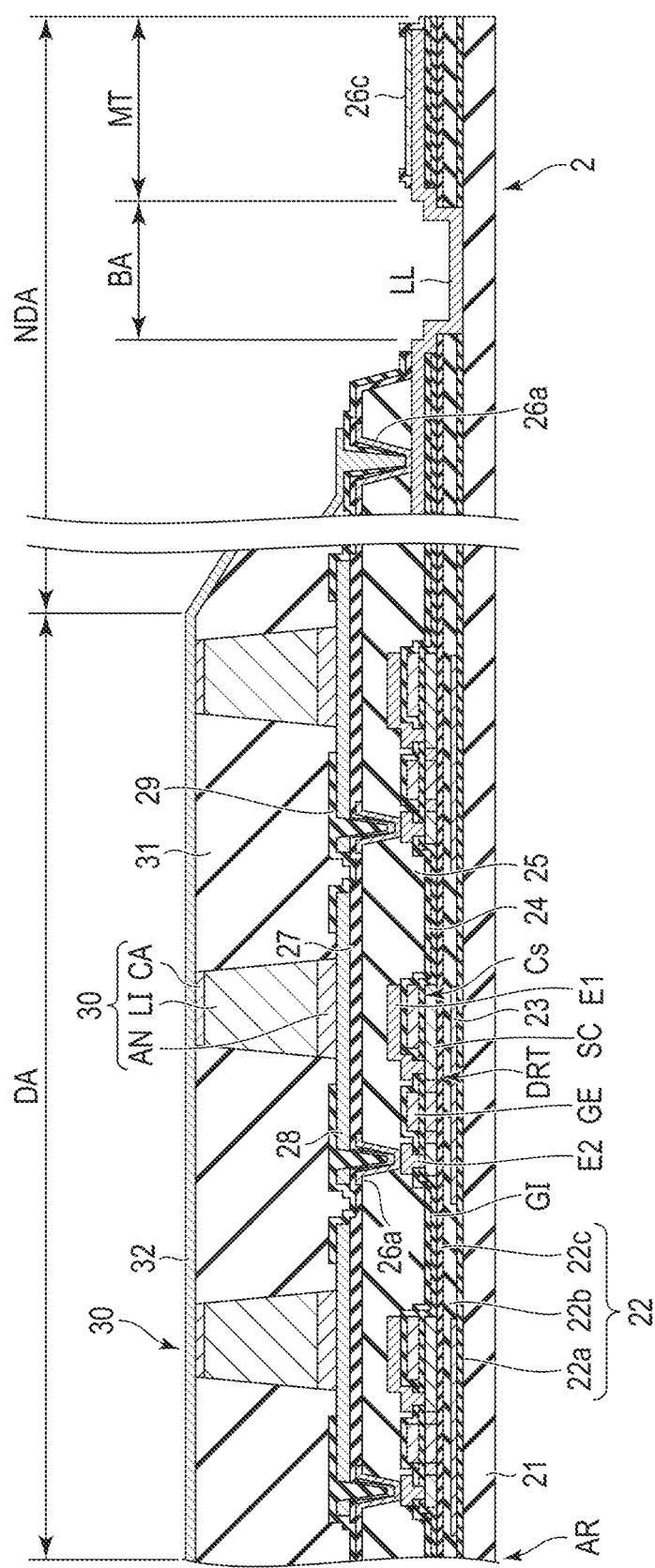
FIG. 3 is a cross-sectional view showing the display device.

FIG. 3 is a cross-sectional view showing the display device. Here, an example in which the above-described minute light emitting diode called the micro LED is mounted as a light emitting element on a pixel electrode is described. FIG. 3 mainly shows the display area DA and the non-display area NDA. The non-display area NDA includes the bent area BA to be bent and the terminal area MT.

As shown in FIG. 3, an array substrate AR of the display panel 2 includes the insulating substrate 21. As the insulating substrate 21, a glass substrate such as quartz or alkali-free glass, or a resin substrate such as polyimide can be mainly used. Any material can be used for the insulating substrate 21 as long as the material can withstand a processing temperature at the time of manufacturing a thin film transistor (TFT). In a case of the insulating substrate 21 being a flexible resin substrate, the display device 1 can be configured as a sheet display. The resin substrate is not limited to polyimide, and other resin materials may be used. In the case of using polyimide or the like for the insulating substrate 21, it may be more appropriate to refer to the insulating substrate 21 as an organic insulating layer or a resin layer.

An undercoat layer 22 having a three-layer laminated structure is provided on the insulating substrate 21. The undercoat layer 22 includes a first layer 22a made of silicon oxide (SiO2), a second layer 22b made of silicon nitride (SiN), and a third layer 22c made of silicon oxide (SiO2). The first layer 22a as the lowermost layer is provided to improve adhesion with the insulating substrate 21 as a base material, the second layer 22b as the intermediate layer is provided as a block film against moisture and impurities, and the third layer 22c as the uppermost layer is provided as a block film for preventing hydrogen atoms contained in the second layer 22b from diffusing to the side of a semiconductor layer SC to be described later. The undercoat layer 22 is not limited to this structure. The undercoat layer 22 may be further laminated or may have a single-layer structure or a two-layer structure. For example, in a case of the insulating substrate 21 being glass, because a silicon nitride film has relatively good adhesion, the silicon nitride film may be directly formed on the insulating substrate 21.

A light shielding layer 23 is arranged on the insulating substrate 21. The position of the light shielding layer 23 is adjusted to a position where a TFT is to be formed later. In the present embodiment, the light shielding layer 23 is made of metal. However, it is sufficient that the light shielding layer 23 is made of material having light shielding properties, such as a black layer. Furthermore, in the present embodiment, the light shielding layer 23 is provided on the first layer 22a and covered with the second layer 22b. Unlike the present embodiment, the light shielding layer 23 may be provided on the insulating substrate 21 and covered with the first layer 22a. Because the light shielding layer 23 can suppress intrusion of light into the back surface of a channel layer of the TFT, it is possible to suppress a change in TFT characteristics caused by light that could be incident from the insulating substrate 21 side. Furthermore, in a case of the light shielding layer 23 being formed of a conductive layer, a back gate effect can be applied to the TFT by applying a predetermined potential to the light shielding layer 23.

A thin film transistor (TFT) such as a drive transistor DRT is formed on the undercoat layer 22. As the TFT, a polycrystalline TFT using polycrystalline for the semiconductor layer SC is taken as an example. In the present embodiment, the semiconductor layer SC is formed using low-temperature polycrystalline. Here, the drive transistor DRT is a P-channel TFT (PchTFT). The semiconductor layer SC of the PchTFT includes a first region, a second region, a channel region between the first area and the second area, and low-concentration impurity regions provided between the channel region and the first region and between the channel region and the second region, respectively. One of the first and second regions functions as a source region, and the other of the first and second regions functions as a drain region. The array substrate AR may include not only the PchTFT but also an N-channel TFT (NchTFT). In that case, the NchTFT and the PchTFT may be formed simultaneously. The semiconductor layer SC made of a semiconductor other than polycrystalline, such as amorphous silicon or an oxide semiconductor.

A gate insulating film GI is made of a silicon oxide film, and a gate electrode GE is made of MoW (molybdenum tungsten). A wiring line and an electrode formed on the gate insulating film GI, such as the gate electrode GE, may be referred to as a first wiring line or a first metal. In addition to a function as a gate electrode of the TFT, the gate electrode GE has a function as a storage capacitor electrode described later. Here, a top gate type TFT is described as an example, but the TFT may be a bottom gate type TFT.

An interlayer insulating film 24 is provided on the gate insulating film GI and the gate electrode GE. The interlayer insulating film 24 is formed by sequentially laminating, for example, a silicon nitride film and a silicon oxide film on the gate insulating film GI and the gate electrode GE. The gate insulating film GI and the interlayer insulating film 24 are not provided in the bent area BA. Therefore, after the gate insulating film GI and the interlayer insulating film 24 are formed in the entire area on the insulating substrate 21 including the bent area BA, the gate insulating film GI and the interlayer insulating film 24 are patterned and at least a portion of the gate insulating film GI and the interlayer insulating film 24 corresponding to the bent area BA is removed. Furthermore, because the undercoat layer 22 is exposed by removing the interlayer insulating film 24 and the like, the undercoat layer 22 is also patterned and a portion thereof corresponding to the bent area BA is removed. After the undercoat layer 22 is removed, for example, polyimide constituting the insulating substrate 21 is exposed. Note that there is a case of the etching of the undercoat layer 22 causing film loss in which the upper surface of the insulating substrate 21 is partially eroded.

In this case, a wiring pattern (not shown) may be formed on a layer below each of a step portion at the end of the interlayer insulating film 24 and the step portion at the end of the undercoat layer 22. According to this, when a leading wiring line LL is formed across the step portion, the leading wiring line LL passes over the wiring pattern. Because the gate insulating film GI is provided between the interlayer insulating film 24 and the undercoat layer 22, and the light shielding layer 23, for example, is provided between the undercoat layer 22 and the insulating substrate 21, a wiring pattern can be formed using these layers.

A first electrode E1, a second electrode E2, and the leading wiring line LL are provided on the interlayer insulating film 24. Each of the first electrode E1, the second electrode E2, and the leading wiring line LL adopts a three-layer laminated structure (Ti-based/Al-based/Ti-based), and includes a lower layer made of a metal material containing titanium (Ti) as a main component such as Ti and an alloy containing Ti, an intermediate layer made of a metal material containing aluminum (Al) as a main component such as Al and an alloy containing Al, and an upper layer made of a metal material containing Ti as a main component such as Ti and an alloy containing Ti. Note that a wiring line or an electrode formed on the interlayer insulating film 24, such as the first electrode E1, may be referred to as a second wiring line or a second metal.

The first electrode E1 is connected to the first region of the semiconductor layer SC, and the second electrode E2 is connected to the second region of the semiconductor layer SC. For example, in a case of the first region of the semiconductor layer SC functioning as a source region, the first electrode E1 is a source electrode, and the second electrode E2 is a drain electrode. The first electrode E1 forms a storage capacitor Cs together with the interlayer insulating film 24 and the gate electrode (storage capacitor electrode) GE of the TFT. The leading wiring line LL extends to a peripheral end of the insulating substrate 21 and forms a terminal for connecting the first circuit substrate 3 and the panel driver (drive IC) 5.

Because the leading wiring line LL is formed so as to cross the bent area BA and reach the terminal part, the leading wiring line LL crosses the step between the interlayer insulating film 24 and the undercoat layer 22. As described above, because the wiring pattern of the light shielding layer 23 is formed in the step portion, even if a step disconnection occurs in the leading wiring line LL at the recess of the step, the leading wiring line can maintain the conduction by being in contact with the wiring pattern below.

A planarization film 25 is formed on the interlayer insulating film 24, the first electrode E1, the second electrode E2, and the leading wiring line LL, and covers the TFT and the leading wiring line LL. As the planarization film 25, an organic insulating material such as photosensitive acrylic is often used. The planarization film 25 is superior in coverage of wiring steps and surface flatness to an inorganic insulating material formed by chemical vapor deposition (CVD) or the like.

The planarization film 25 is removed in pixel contact parts and the peripheral area. A conductive layer 26 is provided on the planarization film 25. The conductive layer 26 is made of, for example, indium tin oxide (ITO) as an oxide conductive layer. The conductive layer 26 includes, for example, a conductive layer 26a that covers a portion where the first electrode E1 and the leading wiring line LL are exposed by removing the planarization film 25. One of the objects of having the conductive layer 26a is to provide the conductive layer as a barrier film to protect the first electrode E1 and the exposed portion of the leading wiring line LL from damage in a manufacturing process. The planarization film 25 and the conductive layer 26 are covered with an insulating layer 27. For example, the insulating layer 27 is formed of a silicon nitride film.

A pixel electrode 28 is formed on the insulating layer 27. The pixel electrode 28 is in contact with the conductive layer 26a through an opening of the insulating layer 27 and is electrically connected to the first electrode E1. Here, the pixel electrode 28 serves as a connection terminal for mounting a light emitting element 30. The pixel electrode 28 is formed of a single conductive layer or a laminate including two or more conductive layers. In the present embodiment, the pixel electrode 28 adopts a two-layer laminated structure (Al-based/Mo-based), and includes a lower layer made of a metal material containing Mo as a main component such as Mo and an alloy containing Mo, and an upper layer made of a metal material containing Al as a main component such as Al and an alloy containing Al. The conductive layer 26 includes a conductive layer 26c that forms a surface of the terminal part.

An insulating layer 29 is provided on the insulating layer 27 and the pixel electrode 28. The insulating layer 29 is made of, for example, silicon nitride. The insulating layer 29 insulates an end and the like of the pixel electrode 28 and has an opening for mounting the light emitting element (micro LED) 30 on a part of a surface of the pixel electrode 28. The size of the opening of the insulating layer 29 is set to be slightly larger than that of the light emitting element 30 in consideration of an amount of mounting shift and the like in a mounting process of the light emitting element 30. For example, in a case of the light emitting element 30 having a mounting area of substantially 10 µm×10 µm, it is preferable that substantially 20 µm×20 µm is secured for the opening.

In the display area DA, the light emitting element 30 is mounted on the array substrate AR. The light emitting element 30 includes an anode AN as a first electrode, a cathode CA as a second electrode, and a light emitting layer LI that emits light. The light emitting element 30 having emission colors of R, G, and B is prepared, and an anode-side terminal is in contact with and fixed to the corresponding pixel electrode 28. The bonding between the anode AN of the light emitting element 30 and the pixel electrode 28 is not particularly limited as long as good conduction can be secured between the anode AN and the pixel electrode, and the objects formed on the array substrate AR are not damaged. A method that can be adopted includes, for example, a reflow step using a low-temperature melting solder material, a method of placing the light emitting element 30 on the array substrate AR with a conductive paste interposed therebetween and then sintering the light emitting element, or a method of solid phase bonding such as ultrasonic bonding using a similar material for the surface of the pixel electrode 28 and the anode AN of the light emitting element.

The light emitting element 30 has the cathode CA on the opposite side of the anode AN electrically connected to the pixel electrode 28. After the light emitting element 30 is mounted on the pixel electrode 28 and the insulating layer 29, an element insulating layer 31 is provided on the pixel electrode 28 and the insulating layer 29. The element insulating layer 31 is formed on the insulating layer 29 and is made of a resin material filled in a void part between the light emitting elements 30. The element insulating layer 31 exposes the surface of the cathode CA of the light emitting element 30.

A counter electrode 32 is located at least in the display area DA and covers the light emitting elements 30 of all the pixels. The counter electrode 32 is arranged on the surfaces of all the cathodes CA on the counter electrode 32 side and the element insulating layer 31, is in contact with all the cathodes CA, and is electrically connected to all the cathodes CA. The counter electrode 32 is shared by all the pixels. The counter electrode 32 is connected to a wiring line (a second power supply line 42 described later) provided on the array substrate AR side at a cathode contact part provided outside the display area DA. Therefore, the counter electrode 32 is held at the same constant potential as the potential of the second power supply line 42, and electrically connects the second power supply line 42 and the cathodes CA of all light emitting elements 30.

The counter electrode 32 needs to be formed as a transparent electrode in order to extract light emitted from the light emitting element 30, and is made of, for example, ITO as a transparent conductive material. Note that the conductive layer 26 made of ITO may be referred to as a first ITO, and the counter electrode 32 formed of ITO may be referred to as a second ITO.

Figure 4:
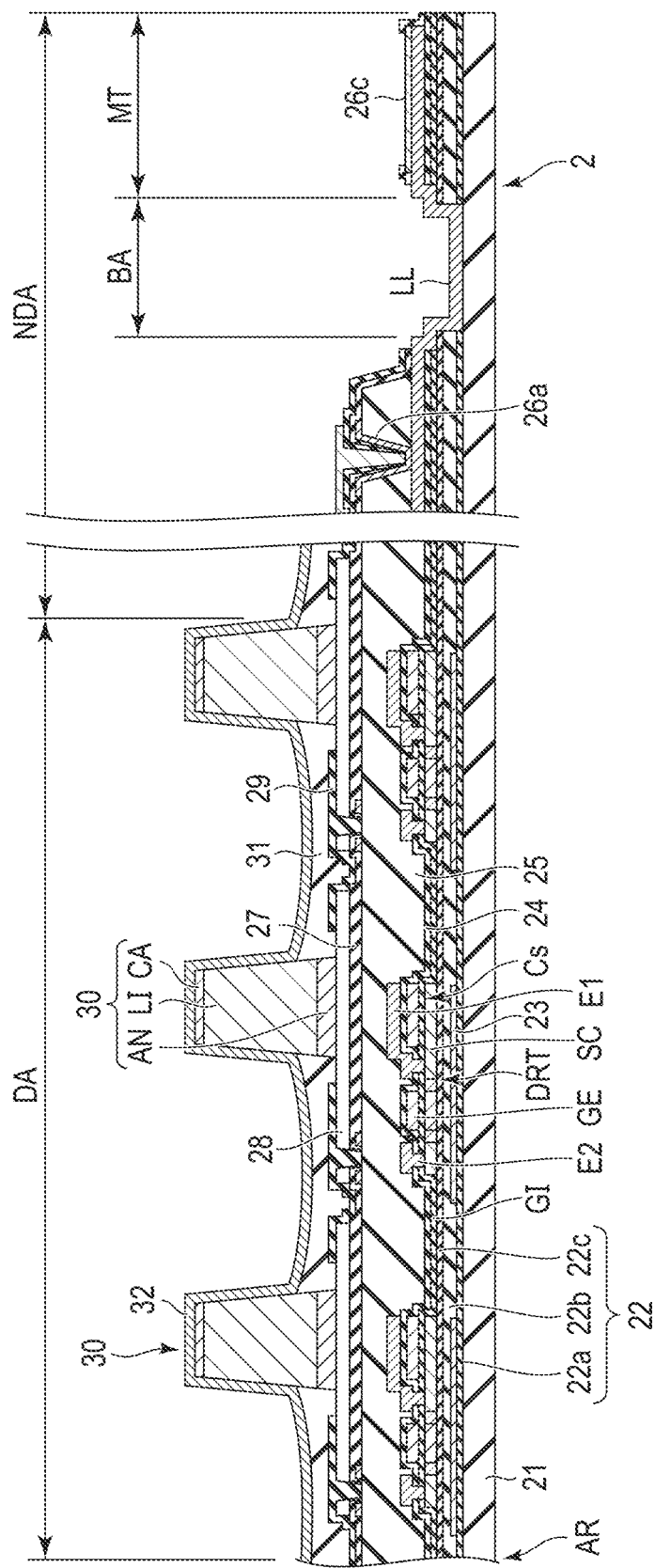
FIG. 4 is a cross-sectional view showing a modification of the display device.

On the other hand, in a case of a side wall portion of the light emitting element 30 being insulated by a protective film or the like, it is not always necessary to fill the gap with a resin material or the like, and the resin material is only required to be able to insulate at least the anode AN and the surface of the pixel electrode 28 exposed from the anode AN. In this case, as shown in FIG. 4, the element insulating layer 31 is formed with a film thickness that does not reach the cathode CA of the light emitting element 30, and subsequently, the counter electrode 32 is formed. Protrusions and recesses due to the mounting of the light emitting element 30 partially remains on the surface on which the counter electrode 32 is formed, but it is sufficient that the material forming the counter electrode 32 can be continuously covered without disconnection.

As described above, the array substrate AR has a structure including the insulating substrate 21 to the counter electrode 32. The display device 1 using the light emitting element 30 according to the present embodiment as a display element is configured, for example, as described above. Note that a cover member such as a cover glass, a touch panel substrate, or the like may be provided on the counter electrode 32 as necessary. The cover member and the touch panel substrate may be provided with a filler using a resin or the like interposed therebetween in order to fill a gap with the display device 1.

Figure 5:
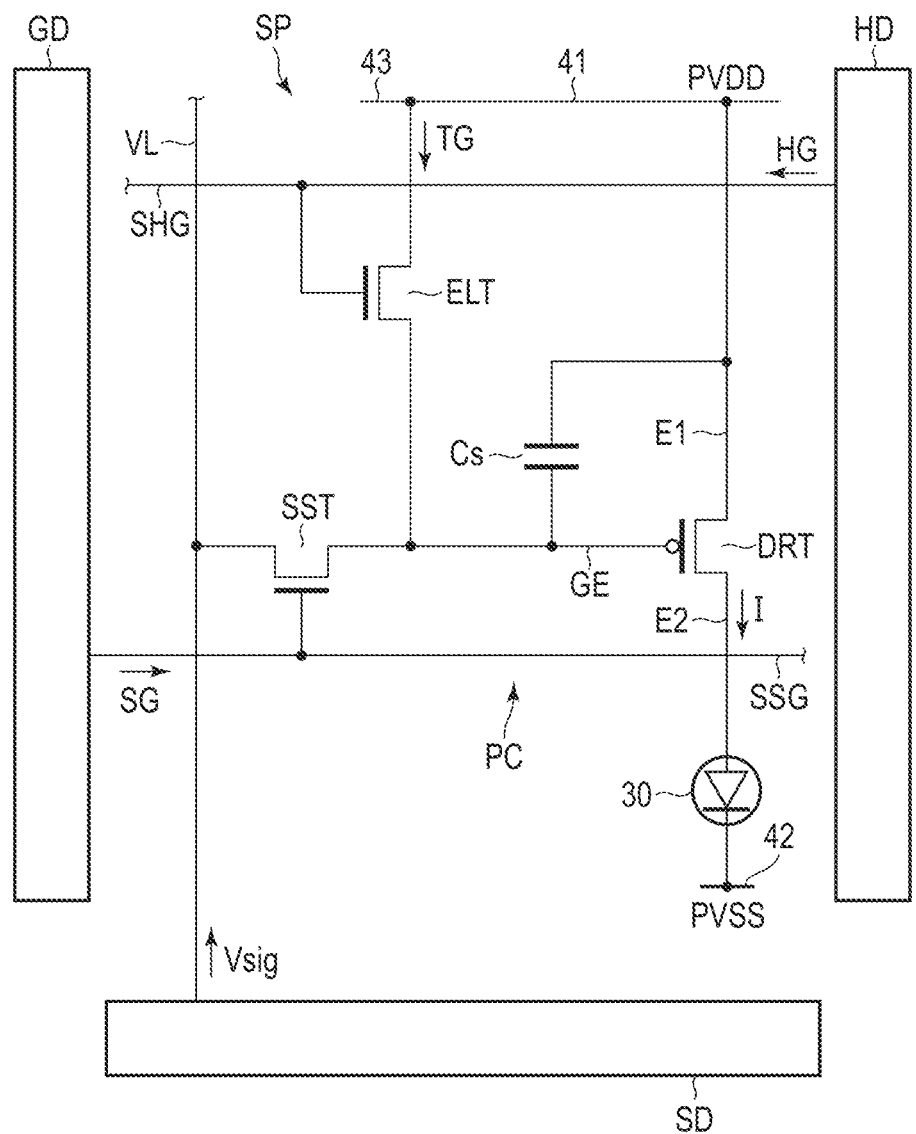
FIG. 5 is a circuit diagram for explaining an example of a configuration of the display device.

Next, a circuit configuration of the display device 1 is described with reference to FIG. 5. FIG. 5 is a circuit diagram for explaining an example of a configuration of the display device 1. The plurality of pixels SP described above are configured in the same manner. Therefore, in FIG. 5, one pixel SP among the plurality of pixels SP is described as a representative.

As shown in FIG. 5, the gate driver GD is configured to apply a first control signal SG to the plurality of gate lines SSG. The erase driver HD is configured to apply a second control signal HG to the plurality of control wiring lines SHG.

The pixel SP includes the light emitting element 30 and a pixel circuit PC that supplies a drive current to the light emitting element 30. The pixel circuit PC is electrically connected to the pixel electrode 28 shown in FIG. 3. The pixel circuit PC includes a drive transistor DRT, a pixel switch SST, a storage capacitor Cs, and a reset switch ELT as a plurality of elements. In FIG. 5, the drive transistor DRT is a PchTFT, and each of the pixel switch SST and the reset switch ELT is an NchTFT.

Note that each of the pixel switch SST and the reset switch ELT may not be constituted of a transistor. It is sufficient that each of the pixel switch SST and the reset switch ELT functions as a switch that is switched on and off.

In the following description, one of the source electrode and the drain electrode of the transistor is referred to as a first electrode, and the other thereof is referred to as a second electrode. Further, one electrode of the capacitive element is referred to as a first electrode, and the other electrode is referred to as a second electrode.

The drive transistor DRT, the pixel electrode 28 (FIG. 3), and the light emitting element 30 are connected in series between the first power supply line 41 and the second power supply line 42. The first power supply line 41 is held at a constant potential, and the second power supply line 42 is held at a constant potential different from the potential of the first power supply line 41. In the present embodiment, a potential PVDD of the first power supply line 41 is higher than a potential PVSS of the second power supply line 42.

The drive transistor DRT includes the first electrode E1 connected to the first power supply line 41, the second electrode E2 connected to the light emitting element 30 (the anode AN in FIG. 3), and the gate electrode GE. The drive transistor DRT is configured to control a current value to the light emitting element 30.

The light emitting element 30 is connected between the second electrode E2 of the drive transistor DRT and the second power supply line 42.

The pixel switch SST is connected between the corresponding source line VL among the plurality of source lines VL and the gate electrode GE of the drive transistor DRT. The gate electrode of the pixel switch SST is connected to the corresponding gate line SSG among the plurality of gate lines SSG. The pixel switch SST is switched to an ON state or an OFF state by the first control signal SG provided via the corresponding gate line SSG. In the present embodiment, the pixel switch SST is maintained in the OFF state by the first control signal SG at a low (L) level and is switched to the ON state by the first control signal SG at a high (H) level.

The storage capacitor Cs is connected to the gate electrode GE of the drive transistor DRT. In the present embodiment, the storage capacitor Cs is connected between the gate electrode GE of the drive transistor DRT and the first electrode (source electrode) E1.

When the pixel switch SST is switched to the ON state, an image signal Vsig is written from the source line VL to the gate electrode GE via the pixel switch SST, and the image signal Vsig is held in the storage capacitor Cs. As a result, an amount of current flowing through the drive transistor DRT is adjusted.

The reset switch ELT is connected between a reset line 43 and the gate electrode GE. In the present embodiment, the reset line 43 is the first power supply line 41. The gate electrode of the reset switch ELT is connected to the corresponding control wiring line SHG among the plurality of control wiring lines SHG. The reset switch ELT is switched to the ON state or the OFF state by a second control signal HG provided via the corresponding control wiring line SHG. In the present embodiment, the reset switch ELT is maintained in the OFF state by the second control signal HG at the L level and is switched to the ON state by the second control signal HG at the H level.

By maintaining the reset switch ELT in the OFF state, the storage capacitor Cs maintains the state of holding the image signal Vsig, and the amount of current flowing through the drive transistor DRT is maintained.

By switching the reset switch ELT to the ON state, a reset signal TG is applied from the reset line 43 to the gate electrode GE and the storage capacitor Cs via the reset switch ELT, and a potential of the gate electrode GE and an amount of charge of the storage capacitor Cs are reset. In this case, the drive transistor DRT does not cause a current to flow.

Note that the drive transistor DRT may be an NchTFT, and in this case, it is sufficient that the storage capacitor Cs is connected between the gate electrode GE and the second electrode (source electrode) E2 of the drive transistor DRT. The reset line 43 may be the second power supply line 42.

Alternatively, in the case of the drive transistor DRT being an NchTFT, it is sufficient to configure the current to flow through the light emitting element 30 in a direction opposite to the present embodiment.

Note that the circuit configuration described in FIG. 5 is an example, and the circuit configuration of the display device 1 may have another configuration as long as the circuit includes the drive transistor DRT, the pixel switch SST, the storage capacitor Cs, and the reset switch ELT described above. For example, another configuration may be added to the circuit configuration described in FIG. 5.

Next, a first operation for each frame period and a second operation between the consecutive first operations, in each pixel SP, are described. The first operation includes a write operation and a light emitting operation. The second operation includes a light emitting period control operation.

In each pixel SP, during the first operation period for performing the first operation, the first control signal SG is switched from the L level to the H level, and the second control signal HG is maintained at the L level. As a result, the pixel switch SST is switched to the ON state, and the reset switch ELT is maintained in the OFF state. At this time, by the source driver SD, the image signal Vsig is written in the gate electrode GE of the drive transistor DRT via the corresponding source line VL and pixel switch SST, and is held in the storage capacitor Cs. In other words, a current corresponding to the image signal Vsig flows to the storage capacitor Cs and the like via the source line VL and the pixel switch SST, and a charge corresponding to the image signal Vsig is accumulated in the storage capacitor Cs. As a result, the write operation to the pixel SP is completed. In the present embodiment, when the write operation is completed, the light emitting operation is immediately started.

Upon shifting to the light emitting operation, in each pixel SP, the first control signal SG is switched from the H level to the L level, and the second control signal HG is maintained at the L level. As a result, the pixel switch SST is switched to the OFF state, and the reset switch ELT is maintained in the OFF state. In the write operation, the amount of current flowing through the drive transistor DRT is adjusted. Therefore, in the light emitting operation, a current I flows through the light emitting element 30 according to the current value determined based on the image signal Vsig, whereby the light emitting element 30 emits light (lights up). In other words, the current I corresponding to the potential of the gate electrode GE of the drive transistor DRT written by the write operation passes through the drive transistor DRT and flows to the light emitting element 30, and the light emitting element 30 emits light.

Here, as a result of examining the light emitting operation of the light emitting element 30, the inventors of the present application have found that the light emitting operation of the light emitting element 30 becomes unstable when the gradation is controlled only by the control of the current I in a case of the current I being a minute current. Therefore, it has been difficult to control the light emitting operation of the light emitting element 30 so as to respond to a dark gradation (low gradation).

Therefore, in the present embodiment, the second operation is performed during the consecutive first operations to control a light emitting period of the light emitting element 30. By combining the control of the current I and the control of the light emitting period of the light emitting element 30, the light emitting operation of the light emitting element 30 can be stabilized even in the dark gradation (low gradation). For example, even if the current I is not set to be a minute current, it is possible to respond to the low gradation by setting the light emitting period of the light emitting element 30 to be short.

In controlling the light emitting period of the light emitting element 30, the light emitting period of the light emitting element 30 from when the first operation is performed to when the next first operation is performed can be set to two or more types. As a result, for example, the display area DA can be classified into a plurality of control areas according to the gradation of the image, and the light emitting periods of the plurality of light emitting elements 30 can be set for each control area. For example, in a case of setting the light emitting period of the light emitting element 30 to two types, in one screen, the light emitting period of the light emitting element 30 located in the bright control area of the image can be set to a normal period, and the light emitting period of the light emitting element 30 located in the dark control area of the image can be set to a period shorter than the normal period.

Next, the second operation in a case of setting the light emitting period of the light emitting element 30 to the normal period is described. In the target pixel SP, during the second operation period for performing the second operation, the first control signal SG is maintained at the L level, and the second control signal HG is maintained at the L level. As a result, the pixel switch SST is maintained in the OFF state, and the reset switch ELT is maintained in the OFF state. At this time, because the storage capacitor Cs maintains the state of holding the image signal Vsig, the amount of current flowing through the drive transistor DRT is maintained, and the light emission of the light emitting element 30 is maintained. Therefore, even after the second operation, the light emitting element 30 emits light until the next first operation is started.

Next, the second operation in a case of setting the light emitting period of the light emitting element 30 to a period shorter than the normal period is described. In the target pixel SP, during the second operation period for performing the second operation, the first control signal SG is maintained at the L level, and the second control signal HG is switched from the L level to the H level. As a result, the pixel switch SST is maintained in the OFF state, and the reset switch ELT is switched to the ON state. At this time, the potential of the gate electrode GE of the drive transistor DRT and the amount of charge of the storage capacitor Cs are reset by the reset signal TG provided via the reset line 43 and the reset switch ELT. Because the drive transistor DRT does not cause the current to flow, the light emitting element 30 is turned off. Therefore, the light emitting element 30 emits light until the second operation is started after the first operation, but the light emitting element 30 is turned off after the second operation.

Figure 6:
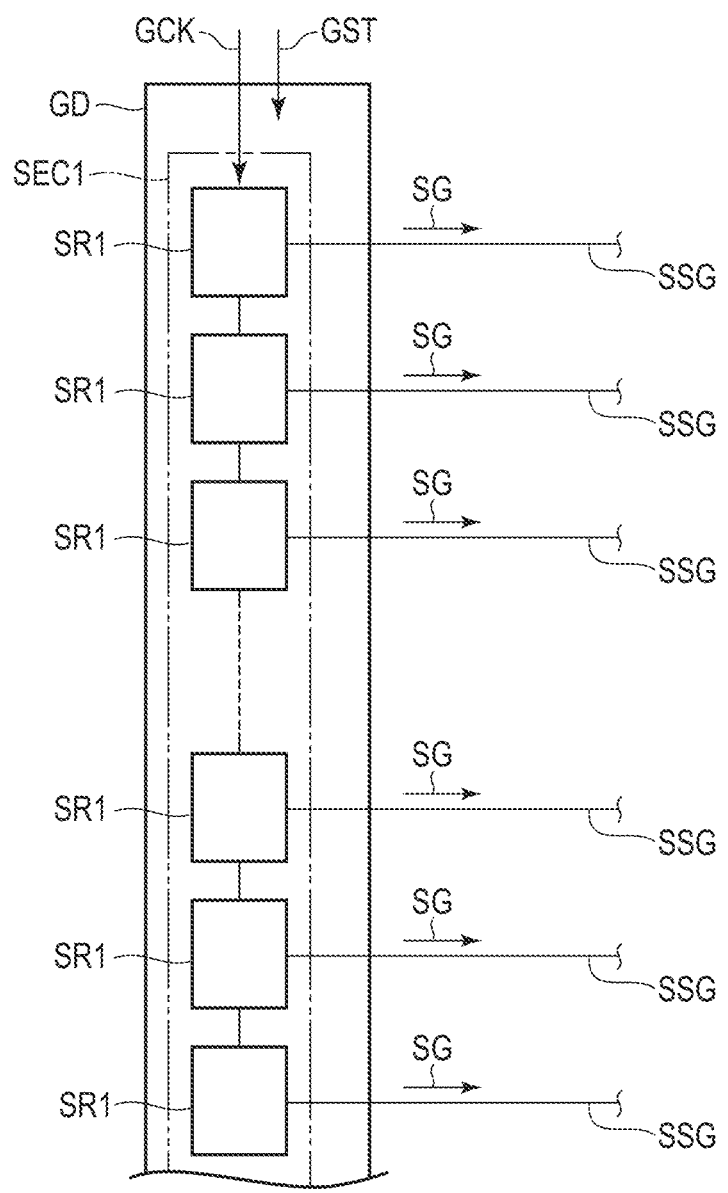

Next, the gate driver GD of the present embodiment is described. FIG. 6 is a circuit diagram showing a part of the gate driver GD shown in FIG. 5 and the like and some of the gate lines SSG.

As shown in FIG. 6, the gate driver GD includes a sequential circuit SEC1. The sequential circuit SEC1 includes a plurality of first shift registers SR1. The plurality of first shift registers SR1 are connected in series. The gate lines SSG are connected to the first shift registers SR1 on a one-to-one basis.

A gate start pulse signal GST and a gate clock signal GCK are supplied from the panel driver 5 to the gate driver GD. The first operation is started at timing when the level of the gate start pulse signal GST is switched from the L level to the H level. Then, during a period in which the level of the gate start pulse signal GST becomes the H level, the gate driver GD starts fetching the gate clock signal GCK. The gate driver GD scans the plurality of gate lines SSG in synchronization with the gate clock signal GCK. That is, the sequential gate driver GD sequentially outputs the first control signal SG at the H level from the gate line SSG of the first row to the gate line SSG of the last row.

Figure 7:
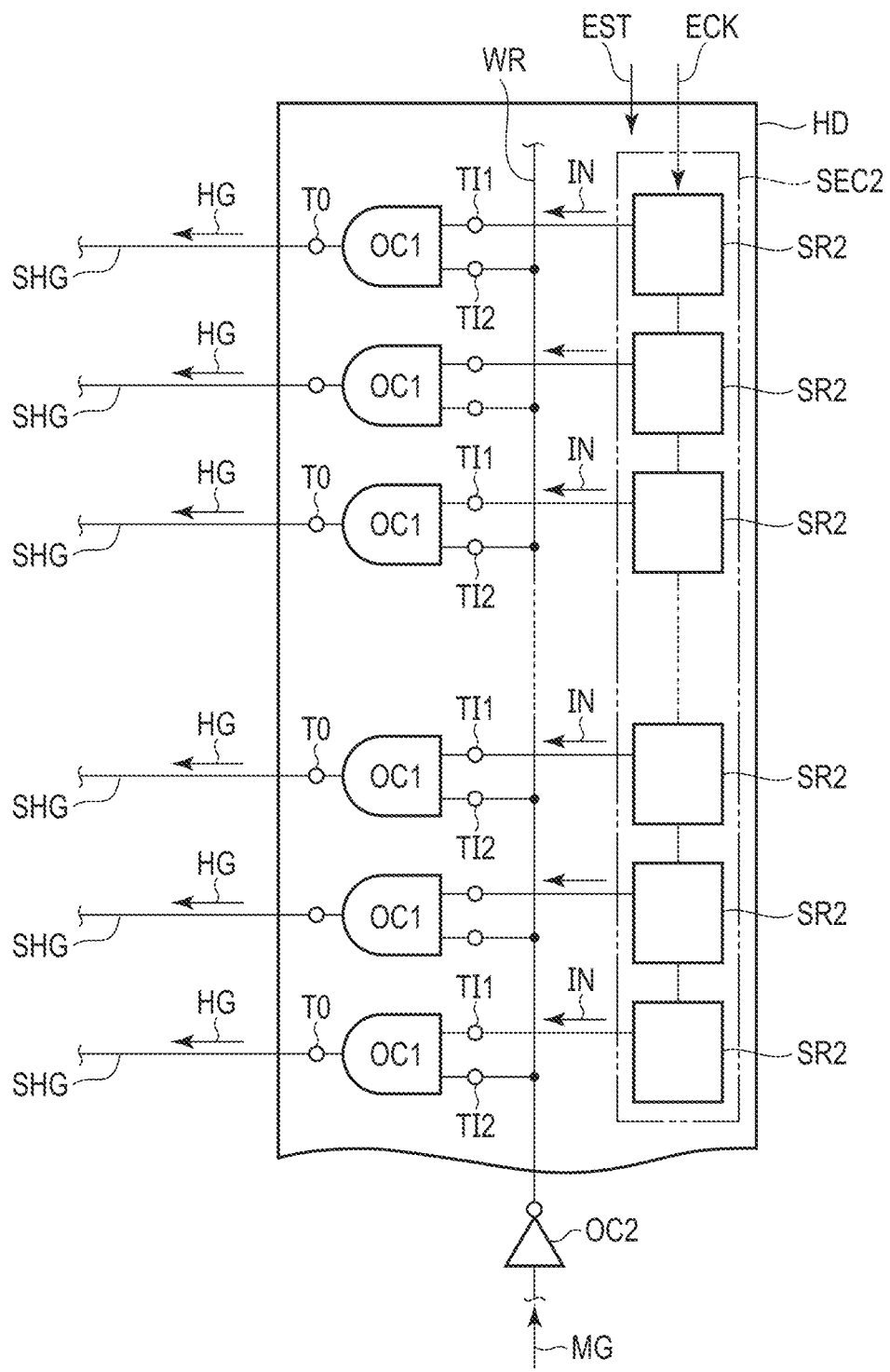

Next, the erase driver HD of the present embodiment is described. FIG. 7 is a circuit diagram showing a part of the erase driver HD shown in FIG. 5 and the like and some of the control wiring lines SHG.

As shown in FIG. 7, the erase driver HD includes a sequential circuit SEC2, a mask wiring line WR, and a plurality of first logic circuits OC1. The sequential circuit SEC2 functions as an erase circuit. The sequential circuit SEC2 includes a plurality of second shift registers SR2. The plurality of second shift registers SR2 are connected in series.

The first logic circuits OC1 are connected to the second shift registers SR2 on a one-to-one basis. In the present embodiment, the first logic circuit OC1 is a conjunction circuit (an AND circuit). In a case of the reset switch ELT being a PchTFT, the first logic circuit OC1 is a non-conjunction circuit (a NAND circuit). The first logic circuit OC1 includes a first input terminal TI1, a second input terminal TI2, and an output terminal TO. The first input terminal TI1 is connected to the corresponding second shift register SR2. The second input terminal TI2 is connected to the mask wiring line WR. The output terminal TO is connected to one corresponding control wiring line SHG.

In the present embodiment, the second logic circuit OC2 is connected to the mask wiring line WR. The second logic circuit OC2 is a NOT circuit. A mask signal MG is input to the mask wiring line WR via the second logic circuit OC2. Therefore, the mask signal MG is input to the second input terminal TI2 of the second logic circuit OC2 with an inverted level.

Note that, depending on the configuration of the first logic circuit OC1, the second logic circuit OC2 may not be used. In this case, the mask signal MG is input to the second input terminal 112 via the mask wiring line WR without being level-inverted.

In the first logic circuit OC1, in a case in which an input signal IN provided from the second shift register SR2 to the first input terminal ill is at the H level and the mask signal MG is at the L level, the second control signal HG at the H level is output from the output terminal TO to the control wiring line SHG. The second control signal HG at the H level referred to here is a signal for switching the reset switch ELT to the ON state.

On the other hand, even if the input signal IN is at the H level, in the case of the mask signal MG being at the H level, the second logic circuit OC2 outputs the second control signal HG at the L level from the output terminal TO to the control wiring line SHG. In a case of the input signal IN being at the L level, the second logic circuit OC2 outputs the second control signal HG at the L level from the output terminal TO to the control wiring line SHG regardless of the level of the mask signal MG. The second control signal HG at the L level referred to here is a signal for maintaining the reset switch ELT in the OFF state.

An erase start pulse signal EST, an erase clock signal ECK, and the mask signal MG are supplied from the panel driver 5 to the erase driver HD. The second operation is started at timing when the level of the erase start pulse signal EST is switched from the L level to the H level. Then, during a period in which the level of the erase start pulse signal EST becomes the H level, the erase driver HD starts fetching the erase clock signal ECK. The erase driver HD scans the plurality of control wiring lines SHG in synchronization with the erase clock signal ECK. That is, the sequential circuit SEC2 sequentially outputs the input signal IN at the H level from the first logic circuit OC1 connected to the control wiring line SHG of the first row to the first logic circuit OC1 connected to the control wiring line SHG of the last row. Then, the erase driver HD sequentially outputs the second control signal HG of the H level or the L level from the control wiring line SHG of the first row to the control wiring line SHG of the last row.

The timing at which the gate start pulse signal GST is switched to the H level and the timing at which the erase start pulse signal EST is switched to the H level are alternately set. A period from when the gate start pulse signal GST is switched to the H level until the erase start pulse signal EST is switched to the H level and a period from when the erase start pulse signal EST is switched to the H level until the gate start pulse signal GST is switched to the H level may have the same length or different lengths.

Figure 8:
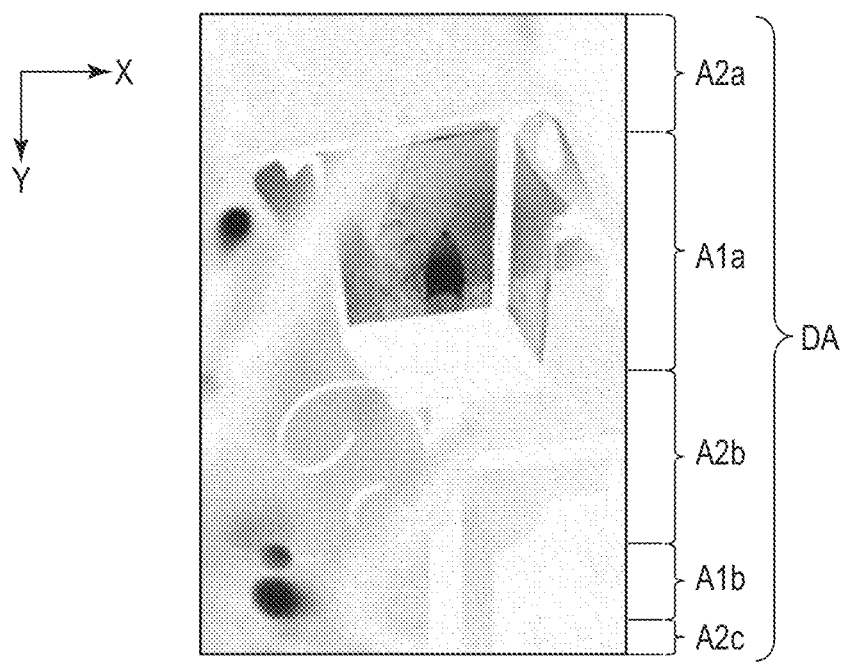
FIG. 8 is a plan view showing a state in which an image is displayed in a display area of the display device.

Next, a display operation of the display device 1 is described. FIG. 8 is a plan view showing a state in which an image is displayed in the display area DA of the display device 1.

As shown in FIG. 8, a gradation value of the image is different for each area. Therefore, the display area DA is classified into a plurality of control areas A according to the gradation of the image. The plurality of control areas A are divided in the second direction Y. An area corresponding to a bright gradation is set as a first control area A1, and an area corresponding to a relatively dark gradation is set as a second control area A2. In the present embodiment, an area where the maximum gradation value is a threshold value and an area where the maximum gradation value is higher than the threshold value are set as the first control area A1, and an area where the maximum gradation value is lower than the threshold value is set as the second control area A2.

Figure 9:
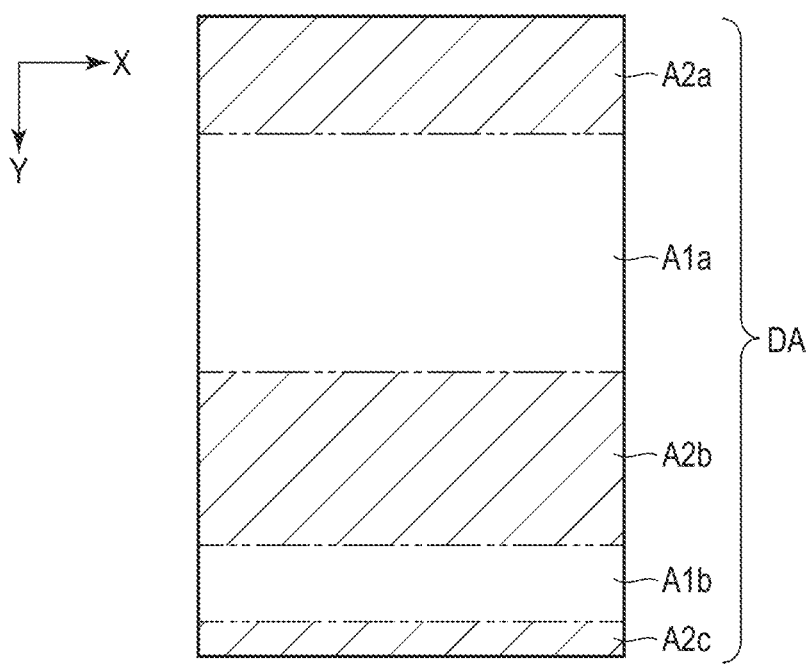
FIG. 9 is a plan view showing a state in which a display area of the display device is classified into a plurality of control areas.

FIG. 9 is a plan view showing a state in which the display area DA of the display device 1 is classified into the plurality of control areas A.

As shown in FIG. 9, in the present embodiment, the display area DA is classified into a plurality of first control areas A1$a$ and A1$b$ and a plurality of second control areas A2$a$, A2$b$, and A2$c$. In the drawing, the second control areas A2$a$, A2$b$, and A2$c$ are shaded. The light emitting period of the light emitting element 30 located in the first control area A1 is set to the normal period. On the other hand, the light emitting period of the light emitting element 30 located in the second control area A2 is set to a period shorter than the normal period.

Figure 10:
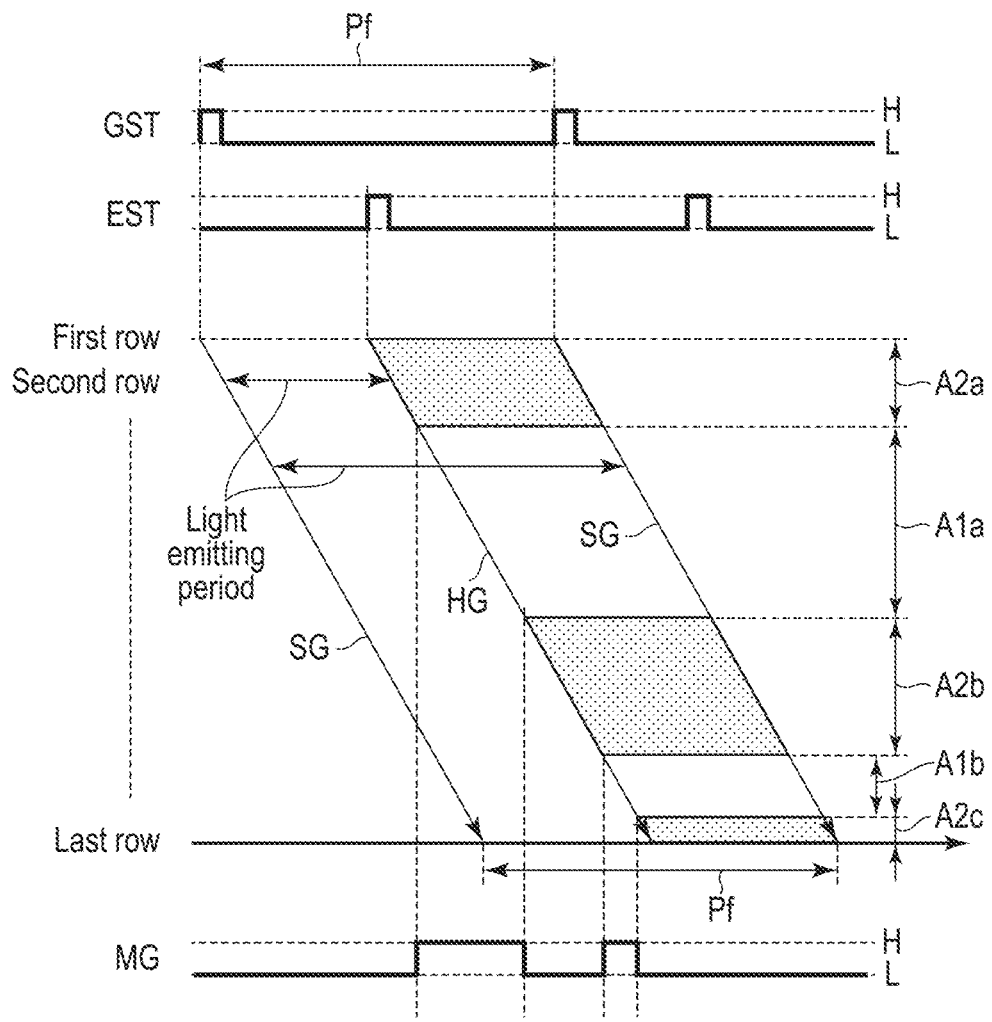
FIG. 10 is a timing chart showing an example of a display operation of the display device when the image shown in FIG. 8 is displayed.

FIG. 10 is a timing chart showing an example of a display operation of the display device 1 when the image shown in FIG. 8 is displayed. Here, a display operation is described which is performed when an image is displayed as shown in FIG. 8 using the display operation of FIG. 10.

As shown in FIG. 10, the gate start pulse signal GST rises at the start of one frame. In other words, the gate start pulse signal GST is switched to the H level. That is, in this example, a period from when the gate start pulse signal GST rises to when the gate start pulse signal rises again corresponds to one frame period Pf. For example, when the display device 1 is driven at 60 Hz, one frame period Pf is about 16.7 ms. Timing at which the gate start pulse signal GST rises and timing at which the erase start pulse signal EST rises are alternately set.

When the first operation is started at the timing when the gate start pulse signal GST rises, the gate driver GD sequentially outputs the first control signal SG at the H level from the gate line SSG of the first row to the gate line SSG of the last row. When the pixel switch SST is switched to the ON state, an image signal Vsig is written from the source line VL to the gate electrode GE via the pixel switch SST, and the image signal Vsig is held in the storage capacitor Cs. As a result, an amount of current flowing through the drive transistor DRT is adjusted.

During the first operation, when the second operation is started at the timing when the erase start pulse signal EST rises, the erase driver HD sequentially outputs the second control signal HG at the H level or L level from the control wiring line SHG of the first row to the control wiring line SHG of the last row. In this example, the erase driver HD outputs the second control signal HG at the H level to the control wiring lines SHG in the second control area A2a, the second control area A2b, and the second control area A2c, and outputs the second control signal HG at the L level to the control wiring lines SHG in the first control area A1a and the first control area A1b.

The mask signal MG is maintained at the L level during a period in which the erase driver HD outputs the second control signal HG at the H level, and the mask signal MG is switched to the H level during a period in which the erase driver HD outputs the second control signal HG at the L level. Thus, the light emitting period of the light emitting element 30 can be made different between the first control area A1 and the second control area A2. In the drawing, a period in which the light emitting element 30 is turned off in the second control area A2 is drawn with a dot pattern.

According to the display device 1 according to the first embodiment configured as described above, it is possible to combine the control of the current I and the control of the light emitting period of the light emitting element 30 by the second operation using the erase driver HD and the like. Therefore, even a low-gradation image can be favorably displayed. In addition, because the low-gradation image can be favorably displayed without making the current I a minute current, the light emitting operation of the light emitting element 30 can be stabilized.

From the above, the display device 1 excellent in display quality can be obtained.

Second Embodiment

Figure 11:
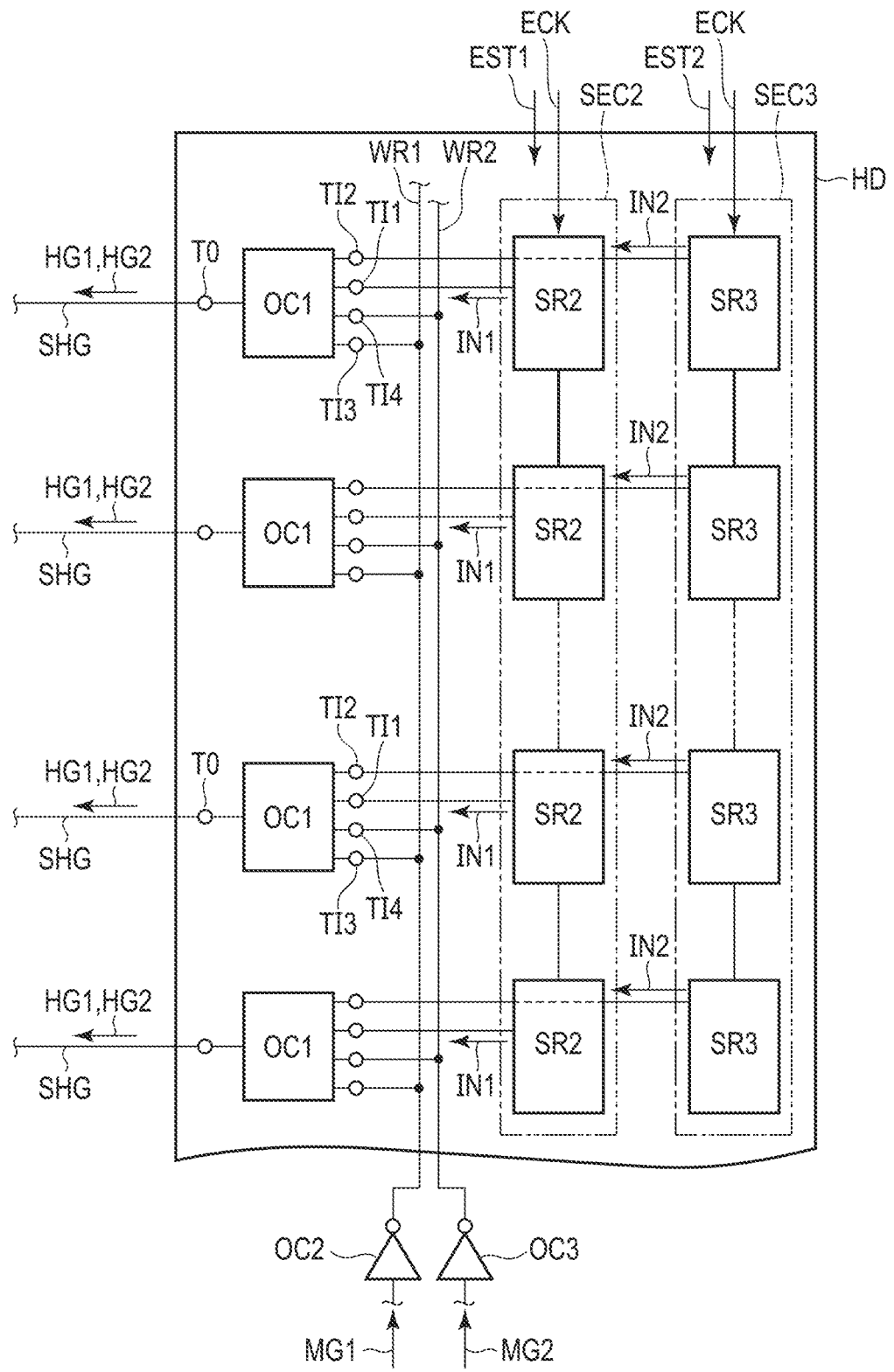
FIG. 11 is a circuit diagram showing a part of an erase driver and some control wiring lines of a display device according to a second embodiment.

Next, a second embodiment is described. The display device 1 of the second embodiment is different from the above-described first embodiment in terms of the configuration of an erase driver HD. FIG. 11 is a circuit diagram showing a part of the erase driver HD and some control wiring lines SHG of the display device 1 according to the second embodiment.

As shown in FIG. 11, the erase driver HD includes a sequential circuit SEC2, a sequential circuit SEC3, a first mask wiring line WR1, a second mask wiring line WR2, and a plurality of first logic circuits OC1. The sequential circuit SEC2 functions as a first erase circuit, and the sequential circuit SEC3 functions as a second erase circuit. The sequential circuit SEC2 includes a plurality of second shift registers SR2. The plurality of second shift registers SR2 are connected in series. The sequential circuit SEC3 includes a plurality of third shift registers SR3. The plurality of third shift registers SR3 are connected in series.

The first logic circuits OC1 are connected to the first mask wiring line WR1 and the second mask wiring line WR2, further connected to the second shift registers SR2 on a one-to-one basis, and connected to the third shift registers SR3 on a one-to-one basis. The first logic circuit OC1 includes a first input terminal TI1, a second input terminal TI2, a third input terminal TI3, a fourth input terminal TI4, and an output terminal TO. The first input terminal TI1 is connected to the corresponding second shift register SR2. The second input terminal TI2 is connected to the corresponding third shift register SR3. The third input terminal TI3 is connected to the first mask wiring line WR1. The fourth input terminal TI4 is connected to the second mask wiring line WR2. The output terminal TO is connected to one corresponding control wiring line SHG.

In the present embodiment, a second logic circuit OC2 is connected to the first mask wiring line WR1, and a third logic circuit OC3 is connected to the second mask wiring line WR2. Each of the second logic circuit OC2 and the third logic circuit OC3 is a NOT circuit. A first mask signal MG1 is input to the first mask wiring line WR1 via the second logic circuit OC2. Therefore, the first mask signal MG1 is input to the third input terminal TI3 of the second logic circuit OC2 with an inverted level. A second mask signal MG2 is input to the second mask wiring line WR2 via the third logic circuit OC3. Therefore, the second mask signal MG2 is input to the fourth input terminal TI4 of the second logic circuit OC2 with an inverted level.

Note that, depending on the configuration of the first logic circuit OC1, the second logic circuit OC2 and the third logic circuit OC3 may not be used. In this case, the first mask signal MG1 is input to the third input terminal 113 via the first mask wiring line WR1 without being level-inverted, and the second mask signal MG2 is input to the fourth input terminal 114 via the second mask wiring line WR2 without being level-inverted.

In the first logic circuit OC1, an input signal IN1 is provided from the second shift register SR2 to the first input terminal TI1, an input signal IN2 is provided from the third shift register SR3 to the second input terminal TI2, the first mask signal MG1 is provided from the first mask wiring line WR1 to the third input terminal TI3, and the second mask signal MG2 is provided from the second mask wiring line WR2 to the fourth input terminal TI4.

The level of the second control signal HG output from the output terminal TO of the first logic circuit OC1 to the control wiring line SHG is determined based on the input signal IN1, the input signal IN2, the first mask signal MG1, and the second mask signal MG2.

The first logic circuit OC1 normally outputs the second control signal HG at the L level to the control wiring line SHG and maintains the reset switch ELT in the OFF state. However, in the case of the following listed conditions, the first logic circuit OC1 outputs the second control signal HG at the H level to the control wiring line SHG and switches the reset switch ELT to the ON state.

A period in which the input signal IN1 is switched to the H level, during the period in which the first mask signal MG1 is at the L level.

A period in which the input signal IN2 is switched to the H level, during the period in which the second mask signal MG2 is at the L level.

In addition to the first mask signal MG1 and the second mask signal MG2, a first erase start pulse signal EST1, a second erase start pulse signal EST2, and an erase clock signal ECK are provided from a panel driver 5 to the erase driver HD.

The operation of a pixel SP in the present embodiment includes a first operation for each frame period, and a second operation and a third operation between the consecutive first operations. The second operation and the third operation each include the light emitting period control operation.

The second operation is started at timing when the level of the first erase start pulse signal EST1 is switched from the L level to the H level. Then, during a period in which the level of the first erase start pulse signal EST1 becomes the H level, the sequential circuit SEC2 starts fetching the erase clock signal ECK. The sequential circuit SEC2 sequentially outputs the input signal IN1 in synchronization with the erase clock signal ECK, and the erase driver HD scans the plurality of control wiring lines SHG. That is, the sequential circuit SEC2 sequentially outputs the input signal IN1 at the H level from the first logic circuit OC1 connected to the control wiring line SHG of the first row to the first logic circuit OC1 connected to the control wiring line SHG of the last row. Then, the erase driver HD sequentially outputs the second control signal HG1 at the H level or L level from the control wiring line SHG of the first row to the control wiring line SHG of the last row.

The third operation is started at timing when the level of the second erase start pulse signal EST2 is switched from the L level to the H level. Then, during a period in which the level of the second erase start pulse signal EST2 turns to the H level, the sequential circuit SEC3 starts fetching the erase clock signal ECK. The sequential circuit SEC3 sequentially outputs the input signal IN2 in synchronization with the erase clock signal ECK, and the erase driver HD scans the plurality of control wiring lines SHG. That is, the sequential circuit SEC3 sequentially outputs the H level input signal IN2 from the first logic circuit OC1 connected to the control wiring line SHG of the first row to the first logic circuit OC1 connected to the control wiring line SHG of the last row. Then, the erase driver HD sequentially outputs the second control signal HG2 at the H level or L level from the control wiring line SHG of the first row to the control wiring line SHG of the last row.

The gate start pulse signal GST, the first erase start pulse signal EST1, and the second erase start pulse signal EST2 are set to sequentially switch to the H level. A period from when the gate start pulse signal GST is switched to the H level until the first erase start pulse signal EST1 is switched to the H level, a period from when the first erase start pulse signal EST1 is switched to the H level until the second erase start pulse signal EST2 is switched to the H level, and a period from when the second erase start pulse signal EST2 is switched to the H level until the gate start pulse signal GST is switched to the H level may have the same length or different lengths.

The erase clock signals ECK are each input to the sequential circuit SEC2 and the sequential circuit SEC3 in synchronization with each other. However, the erase clock signals ECK may each be input to the sequential circuit SEC2 and the sequential circuit SEC3 without being synchronized. Alternatively, clock signals having different pulse waveforms may be input to the sequential circuit SEC2 and the sequential circuit SEC3.

Next, a display operation of the display device 1 is described. FIG. 12 is a timing chart showing an example of the display operation of the display device 1 according to the second embodiment. Here, a description is made of the display operation in a case in which a display area DA is classified into a first control area A1, a plurality of second control areas A2a and A2b, and a plurality of third control areas A3a and A3b. As is described later, the light emitting period of a light emitting element 30 located in the first control area A1 is set to the normal period, the light emitting period of the light emitting element 30 located in the second control area A2 is set to a period shorter than the normal period, and the light emitting period of the light emitting element 30 located in the third control area A3 is set to a period that is the shortest.

As shown in FIG. 12, the gate start pulse signal GST rises at the start of one frame. In this example, a period from when the gate start pulse signal GST rises to when the gate start pulse signal rises again corresponds to one frame period Pf. Timing at which the gate start pulse signal GST rises, timing at which the first erase start pulse signal EST1 rises, and timing at which the second erase start pulse signal EST2 rises are set in order.

When the first operation is started at the timing when the gate start pulse signal GST rises, the gate driver GD sequentially outputs the first control signal SG at the H level from the gate line SSG of the first row to the gate line SSG of the last row. When the pixel switch SST is switched to the ON state, an image signal Vsig is written from the source line VL to the gate electrode GE via the pixel switch SST, and the image signal Vsig is held in the storage capacitor Cs. As a result, an amount of current flowing through the drive transistor DRT is adjusted.

During the first operation, when the second operation is started at the timing when the first erase start pulse signal EST1 rises, the erase driver HD (sequential circuit SEC2) sequentially outputs the second control signal HG1 at the H level or L level from the control wiring line SHG of the first row to the control wiring line SHG of the last row. In this example, the erase driver HD outputs the second control signal HG1 at the H level to the third control area A3a and the third control area A3b, and outputs the second control signal HG1 at the L level to the first control area A1, the second control area A2a, and the second control area A2b.

The first mask signal MG1 is maintained at the L level during a period in which the erase driver HD outputs the second control signal HG1 at the H level, and the first mask signal MG1 is switched to the H level during a period in which the erase driver HD outputs the second control signal HG1 at the L level. Thus, the light emitting period of the light emitting element 30 can be made different between the first control area A1 and the second control area A2, and the third control area A3.

Further, during the second operation, when the third operation is started at the timing when the second erase start pulse signal EST2 rises, the erase driver HD (sequential circuit SEC3) sequentially outputs the second control signal HG2 at the H level or L level from the control wiring line SHG of the first row to the control wiring line SHG of the last row. In this example, the erase driver HD outputs the second control signal HG2 at the H level to the second control area A2a, the second control area A2b, the third control area A3a, and the third control area A3b, and outputs the second control signal HG2 at the L level to the first control area A1.

The second mask signal MG2 is maintained at the L level during a period in which the erase driver HD outputs the second control signal HG2 at the H level, and the second mask signal MG2 is switched to the H level during a period in which the erase driver HD outputs the second control signal HG2 at the L level. As a result, the light emitting period of the light emitting element 30 can be made different between the second control area A2 and the third control area A3. In the drawing, a period in which the light emitting element 30 is turned off in the second control area A2 and the third control area A3 is drawn with a dot pattern.

The display device 1 according to the second embodiment configured as described above can also obtain the same effects as those of the first embodiment described above. In the second embodiment, the erase driver HD includes two circuits which are the sequential circuit SEC2 (first erase circuit) and the sequential circuit SEC3 (second erase circuit). Therefore, the light emitting period of the light emitting element 30 can be selected from three types.

Third Embodiment

Figure 13:
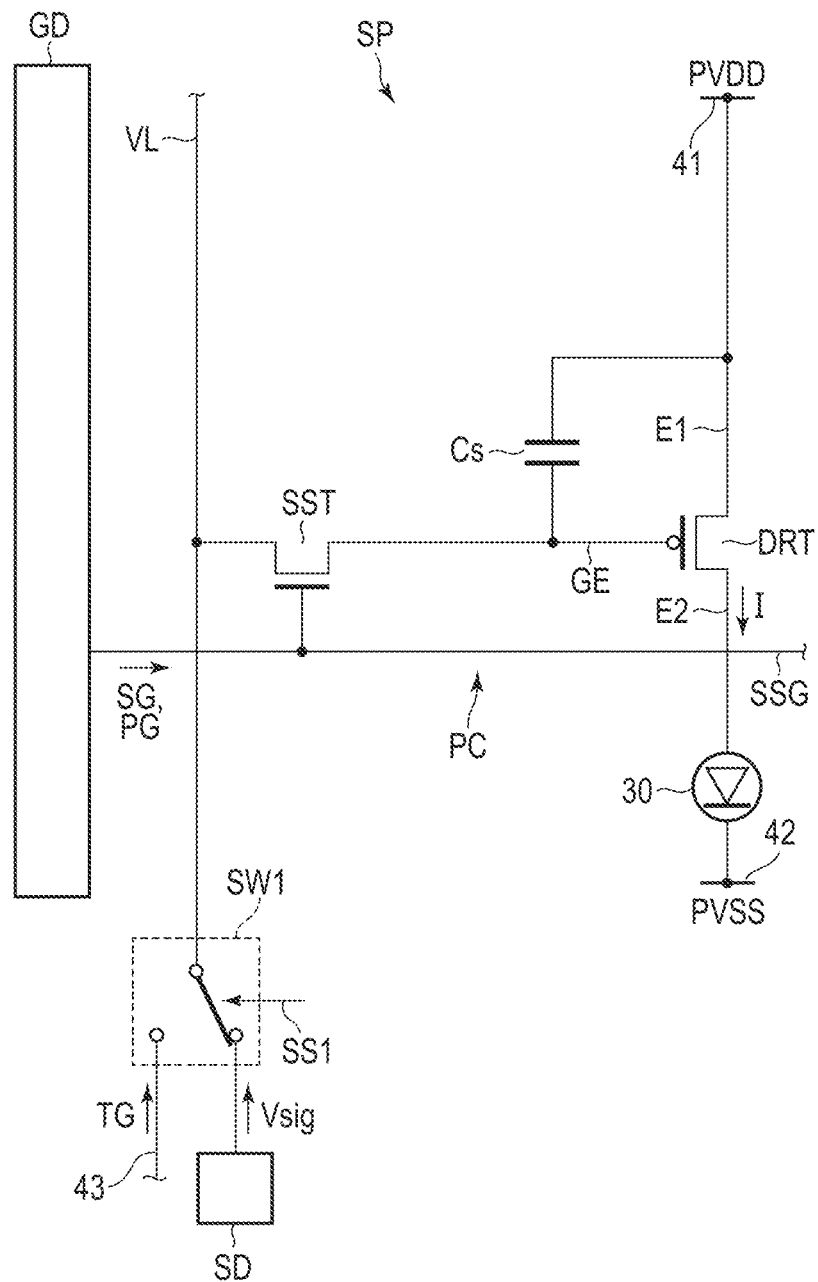
FIG. 13 is a circuit diagram for explaining an example of a configuration of a display device according to a third embodiment.

Next, a third embodiment is described. FIG. 13 is a circuit diagram for explaining an example of a configuration of a display device 1 according to the third embodiment.

As shown in FIG. 13, the display device 1 of the third embodiment is different from the above-described first embodiment in that the display device 1 is formed without an erase driver HD, a control wiring line SHG, and a reset switch ELT. A gate driver GD is configured to apply the first control signal SG and a second control signal PG to a gate line SSG.

A switch SW1 is connected to a source line VL. The switch SW1 is switched between a state in which the source line VL is connected to a source driver SD and a state in which the source line VL is connected to a reset line 43 based on a control signal SS1. Examples of the control signal SS1 include the gate clock signal GCK. The source line VL is connected to the source driver SD when the gate clock signal GCK is at the H level, and the source line VL is connected to the reset line 43 when gate clock signal GCK is at the L level. In the third embodiment, the reset line 43 is a wiring line held at a constant potential. The potential of the reset line 43 is a potential at the H level, and is, for example, the same as the potential PVDD of a first power supply line 41. The reset signal TG, which is a signal at the H level, is provided from the reset line 43 to the source line VL via the switch SW1.

Figure 14:
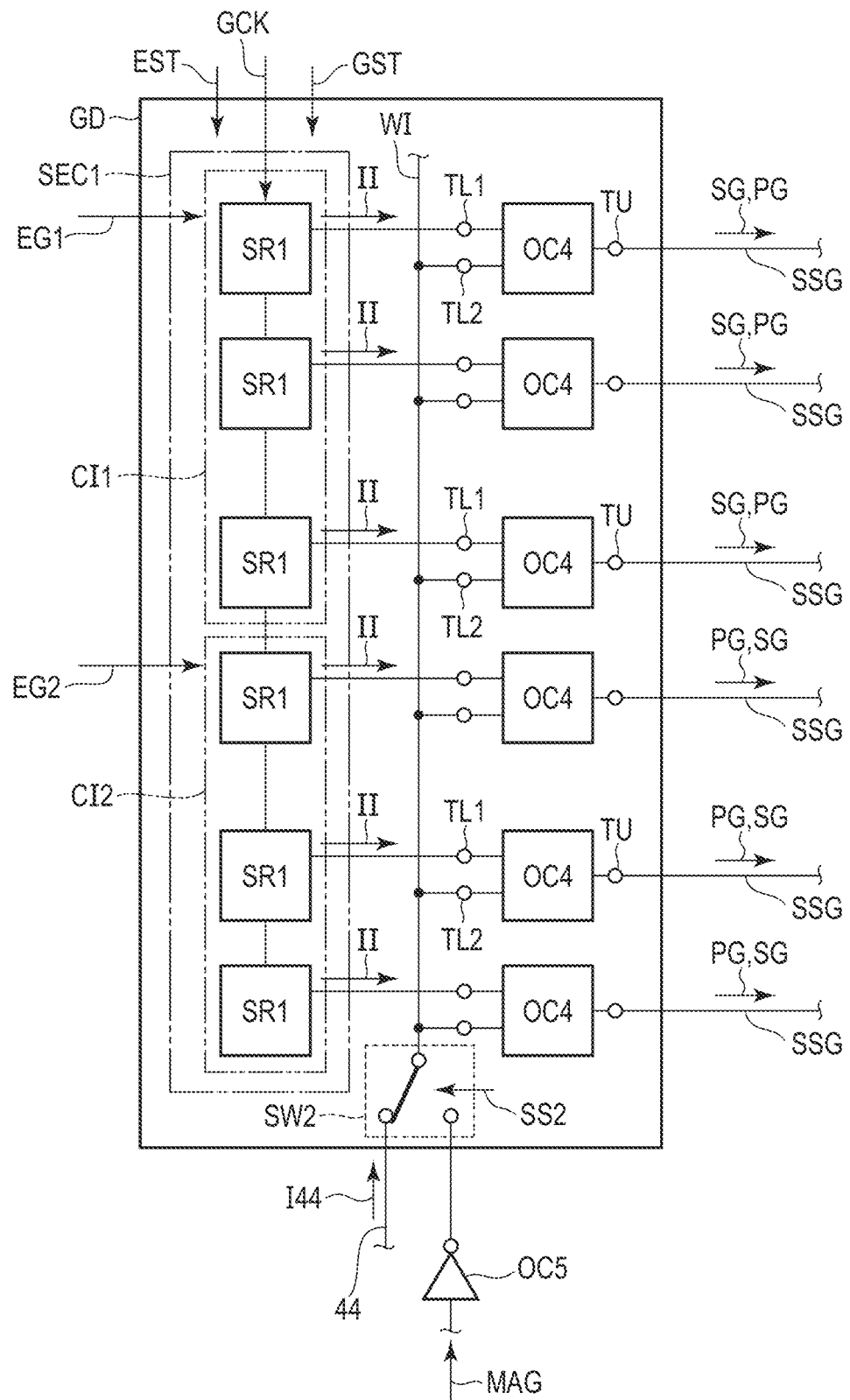
FIG. 14 is a circuit diagram showing a gate driver and some gate lines shown in FIG. 13.

FIG. 14 is a circuit diagram showing the gate driver GD and some of the gate lines SSG shown in FIG. 13.

As shown in FIG. 14, the configuration of the gate driver GD is also different from that of the above-described first embodiment. The gate driver GD includes a sequential circuit SEC1, a mask wiring line WI, and a plurality of fourth logic circuits OC4. The sequential circuit SEC1 includes a plurality of first shift registers SR1. The plurality of first shift registers SR1 are connected in series. The gate driver GD includes a first circuit CI1 including the plurality of consecutive first shift registers SR1 and a second circuit CI2 including the plurality of remaining consecutive first shift registers SR1.

The first circuit CI1 is connected to the plurality of gate lines SSG continuous in the second direction Y via the fourth logic circuit OC4. The second circuit CI2 is connected to the remaining plurality of gate lines SSG continuous in the second direction Y via the fourth logic circuit OC4. In the present embodiment, the number of the gate lines SSG connected to the first circuit CI1 is equal to the number of the gate lines SSG connected to the second circuit CI2.

The fourth logic circuits OC4 are connected to the first shift registers SR1 on a one-to-one basis. The fourth logic circuit OC4 includes a first input terminal TL1, a second input terminal TL2, and an output terminal TU. The first input terminal TL1 is connected to the corresponding first shift register SR1. The second input terminal TL2 is connected to the mask wiring line WI. The output terminal TU is connected to one corresponding gate line SSG.

A switch SW2 is connected to the mask wiring line WI. The switch SW2 is switched between a state in which the mask wiring line WI is connected to a third power supply line 44 and a state in which the mask wiring line WI is connected to a fifth logic circuit OC5 based on a control signal SS2. Examples of the control signal SS2 include the gate clock signal GCK. The mask wiring line WI is connected to the third power supply line 44 when the control signal SS2 (gate clock signal GCK) is at the H level, and the mask wiring line WI is connected to the fifth logic circuit OC5 when the control signal SS2 (gate clock signal GCK) is at the L level. In the third embodiment, the third power supply line 44 is a wiring line held at a constant potential at the H level.

In a state in which the switch SW2 connects the mask wiring line WI to the third power supply line 44, an input signal I44 that is a signal at the H level is provided from the third power supply line 44 to the mask wiring line WI via the switch SW2.

In the present embodiment, the fifth logic circuit OC5 is a NOT circuit. In a state in which the switch SW2 connects the mask wiring line WI to the fifth logic circuit OC5, a mask signal MAG is input to the mask wiring line WI via the fifth logic circuit OC5 and the switch SW2. Therefore, the mask signal MAG is input to the second input terminal TL2 of the fourth logic circuit OC4 with an inverted level.

The gate start pulse signal GST, the erase start pulse signal EST, and the gate clock signal GCK are supplied from the panel driver 5 to the gate driver GD. Further, a first control input signal (first enable signal) EG1 is provided to the first circuit CI1, and a second control input signal (second enable signal) EG2 is provided to the second circuit CI2.

The first operation is started at timing when the level of the gate start pulse signal GST is switched from the L level to the H level. The first operation is performed in a first period of each horizontal scanning period. In the first operation, the first control input signal EG1 and the second control input signal EG2 have the same pulse waveform as that of the gate clock signal GCK, and turn to the H level in the first period and turn to the L level in a second period.

During a period in which the level of the gate start pulse signal GST becomes the H level, the gate driver GD starts fetching the gate clock signal GCK. The sequential circuit SEC1 sequentially outputs an input signal I1 at the H level from the fourth logic circuit OC4 connected to the gate line SSG of the first row to the fourth logic circuit OC4 connected to the gate line SSG of the last row. In all the first periods, the input signal I44 at the H level is input to the second input terminal TL2 of the fourth logic circuit OC4. In the present embodiment, the fourth logic circuit OC4 is an AND circuit. Therefore, the gate driver GD sequentially scans the plurality of gate lines SSG every first period based on the input signal I1 and the input signal I44. The gate driver GD sequentially outputs the first control signal SG at the H level from the gate line SSG of the first row to the gate line SSG of the last row. In the present embodiment, in all the first periods, the level of the first control signal SG output from the fourth logic circuit OC4 is the same as the level of the input signal I1.

On the other hand, the second operation is started at timing when the level of the erase start pulse signal EST is switched from the L level to the H level. The second operation is performed in the second period following the first period in each horizontal scanning period. In the second operation, the first control input signal EG1 and the second control input signal EG2 are inverted signals of the gate clock signal GCK, and turn to the L level in the first period and turn to the H level in the second period.

During a period in which the level of the erase start pulse signal EST turns to the H level, the gate driver GD starts fetching the gate clock signal GCK. The sequential circuit SEC1 sequentially outputs an input signal II at the H level from the fourth logic circuit OC4 connected to the gate line SSG of the first row to the fourth logic circuit OC4 connected to the gate line SSG of the last row. The mask signal MAG is input to the fourth logic circuit OC4 every second period. Therefore, the gate driver GD sequentially scans the plurality of gate lines SSG every second period based on the input signal II and the inverted signal of the mask signal MAG. The gate driver GD sequentially outputs the second control signal PG at the H level or L level from the gate line SSG of the first row to the gate line SSG of the last row.

The timing at which the gate start pulse signal GST is switched to the H level and the timing at which the erase start pulse signal EST is switched to the H level are alternately set. A period from when the gate start pulse signal GST is switched to the H level until the erase start pulse signal EST is switched to the H level has an equal length to a period from when the erase start pulse signal EST is switched to the H level until the gate start pulse signal GST is switched to the H level. However, when the number of the gate lines SSG connected to the first circuit CI1 is different from the number of the gate lines SSG connected to the second circuit CI2, the two periods have different lengths.

As described above, in an optional period, the first circuit CI1 provides one of the first control signal SG and the second control signal PG to the corresponding gate line SSG, and the second circuit CI2 provides the other of the first control signal SG and the second control signal PG to the corresponding gate line SSG.

Here, the focus is made on each of pixels SP.

In the first operation, in the first period, the image signal Vsig is provided to the corresponding source line VL, and a pixel switch SST is switched to the ON state based on the first control signal SG. At this time, the image signal Vsig is written in a gate electrode GE of a drive transistor DRT via the corresponding source line VL and pixel switch SST, and is held in a storage capacitor Cs. Then, the amount of current flowing through the drive transistor DRT is adjusted.

In the second operation, it is assumed that, in the second period, the reset signal TG is provided to the corresponding source line VL, and the pixel switch SST is maintained in the OFF state based on the second control signal PG. At this time, the storage capacitor Cs maintains the state of holding the image signal Vsig, and the amount of current flowing through the drive transistor DRT is maintained.

On the other hand, in the second operation, it is assumed that, in the second period, the reset signal TG is provided to the corresponding source line VL, and the pixel switch SST is switched to the ON state based on the second control signal PG. At this time, the potential of the gate electrode GE and the amount of charge of the storage capacitor Cs are reset by the reset signal TG provided via the source line VL and the pixel switch SST. Then, the drive transistor DRT does not cause the current to flow.

Figure 15:
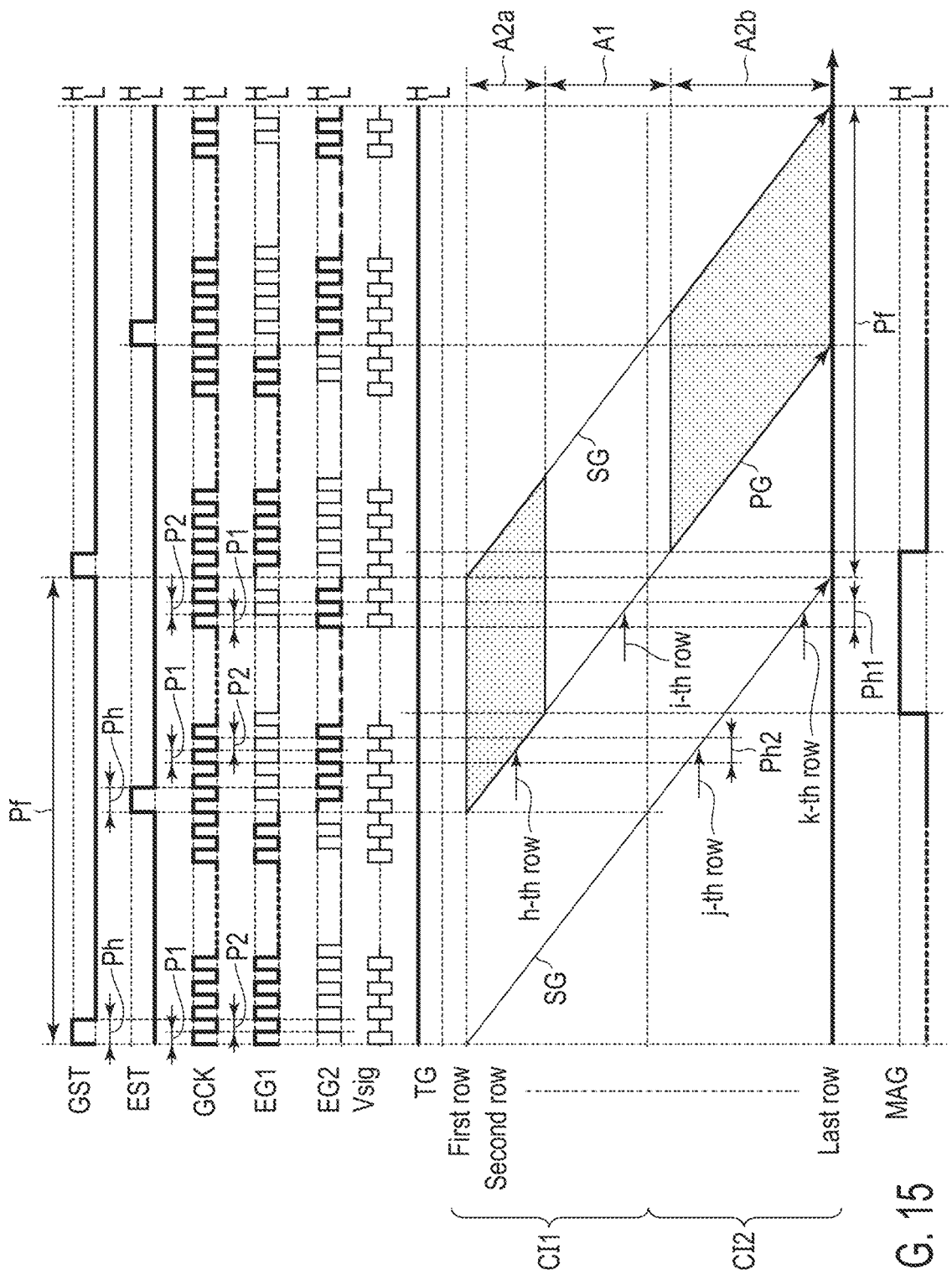
FIG. 15 is a timing chart showing an example of a display operation of the display device according to the third embodiment.

Next, a display operation of the display device 1 is described. FIG. 15 is a timing chart showing an example of the display operation of the display device 1 according to the third embodiment. Here, a description is made of the display operation in a case in which the display area DA is classified into the first control area A1 and the plurality of second control areas A2a and A2b. The light emitting period of a light emitting element 30 located in the first control area A1 is set to the normal period, and the light emitting period of the light emitting element 30 located in the second control area A2 is set to a period shorter than the normal period.

As shown in FIG. 15, the gate start pulse signal GST rises at the start of one frame. In this example, a period from when the gate start pulse signal GST rises to when the gate start pulse signal rises again corresponds to one frame period Pf. One frame period Pf has a plurality of horizontal scanning periods Ph. Each horizontal scanning period Ph includes a first period P1 and a second period P2 following the first period P1.

Timing at which the gate start pulse signal GST rises and timing at which the erase start pulse signal EST rises are set in order.

When the gate start pulse signal GST rises, the first control input signal EG1 is synchronized with the gate clock signal GCK and turns to a pulse signal having the same waveform as the gate clock signal GCK, and the second control input signal EG2 turns to an inverted signal of the gate clock signal GCK. Thereafter, when the erase start pulse signal EST rises, the waveforms of the first control input signal EG1 and the second control input signal EG2 are inverted. Thereafter, also when the gate start pulse signal GST rises again, the waveforms of the first control input signal EG1 and the second control input signal EG2 are inverted again.

When the first operation is started at the timing when the gate start pulse signal GST rises, the gate driver GD sequentially outputs the first control signal SG at the H level from the gate line SSG of the first row to the gate line SSG of the last row in the plurality of first periods P1. When the pixel switch SST is switched to the ON state, an image signal Vsig is written from the source line VL to the gate electrode GE via the pixel switch SST, and the image signal Vsig is held in the storage capacitor Cs. As a result, an amount of current flowing through the drive transistor DRT is adjusted.

During the first operation, when the second operation is started at the timing when the erase start pulse signal EST rises, the gate driver GD sequentially outputs the second control signal PG at the H level or L level from the gate line SSG of the first row to the gate line SSG of the last row. In this example, the gate driver GD outputs the second control signal PG at the H level to the second control area A2a and the second control area A2b, and outputs the second control signal PG at the L level to the first control area A1.

The mask signal MAG is maintained at the L level during a period in which the gate driver GD outputs the second control signal PG at the H level, and the mask signal MAG is switched to the H level during a period in which the gate driver GD outputs the second control signal PG at the L level. Thus, the light emitting period of the light emitting element 30 can be made different between the first control area A1 and the second control area A2. In the drawing, a period in which the light emitting element 30 is turned off in the second control area A2 is drawn with a dot pattern.

Next, the focus is made on one horizontal scanning period Ph1 in one frame period Pf.

In the first period P1 of the one horizontal scanning period Ph1, the second circuit CI2 switches the pixel switch SST to the ON state based on the first control signal SG in each pixel SP of the k-th row, and the image signal Vsig is written in the gate electrode GE and held in the storage capacitor Cs. The second circuit CI2 maintains the pixel switch SST in the OFF state based on the first control signal SG in each pixel SP of the corresponding remaining row.

In the same first period P1, the first circuit CI1 maintains the pixel switch SST in the OFF state based on the second control signal PG in all of the corresponding plurality of pixels SP.

Next, in the second period P2 of the one horizontal scanning period Ph1, the second circuit CI2 maintains the pixel switch SST in the OFF state based on the first control signal SG in all of the corresponding plurality of pixels SP.

In the same second period P2, the first circuit CI1 maintains the pixel switch SST in the OFF state based on the second control signal PG in all of the corresponding plurality of pixels SP.

Next, the focus is made on another one horizontal scanning period Ph2 in one frame period Pf.

In the first period P1 of the one horizontal scanning period Ph2, the second circuit CI2 switches the pixel switch SST to the ON state based on the first control signal SG in each pixel SP of the j-th row, and the image signal Vsig is written in the gate electrode GE and held in the storage capacitor Cs. The second circuit CI2 maintains the pixel switch SST in the OFF state based on the first control signal SG in each pixel SP of the corresponding remaining row.

In the same first period P1, the first circuit CI1 maintains the pixel switch SST in the OFF state based on the second control signal PG in all of the corresponding plurality of pixels SP.

Next, in the second period P2 of the one horizontal scanning period Ph2, the second circuit CI2 maintains the pixel switch SST in the OFF state based on the first control signal SG in all of the corresponding plurality of pixels SP.

In the same second period P2, the first circuit CI1 switches the pixel switch SST to the ON state based on the second control signal PG in each pixel SP of the h-th row, the potential of the gate electrode GE and the amount of charge of the storage capacitor Cs are reset, and the drive transistor DRT does not cause the current to flow. The first circuit CI1 maintains the pixel switch SST in the OFF state based on the second control signal PG in each pixel SP of the corresponding remaining rows.

The display device 1 according to the third embodiment configured as described above can also obtain the same effects as those of the first embodiment described above. In the third embodiment, the light emitting period of the light emitting element 30 can be set using the gate driver GD without the erase driver HD.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the above embodiments, the micro LED display device using the micro LED as the light emitting element has been mainly described. However, the display device 1 according to the present embodiment may be an organic electroluminescence (EL) display device or the like using an organic EL element as a light emitting element.

What is claimed is:

1. A display device comprising:
   a first power supply line;
   a second power supply line;
   a reset line;
   a plurality of pixels arranged in a row direction and a column direction;
   a plurality of gate lines, each of the gate lines being shared by the plurality of pixels arranged in the row direction;
   a plurality of source lines, each of the source lines being shared by the plurality of pixels arranged in the column direction; and
   a first driver that provides a first control signal and a second control signal to the plurality of gate lines,
   wherein
   each of the pixels includes:
      a drive transistor and a light emitting element connected in series between the first power supply line and the second power supply line;
      a pixel switch connected between a corresponding source line among the plurality of source lines and a gate electrode of the drive transistor, the pixel switch being switched between an ON state and an OFF state by the first control signal or the second control signal provided via a corresponding gate line among the plurality of gate lines; and
      a storage capacitor connected to the gate electrode,
   the first driver includes a first circuit connected to the plurality of gate lines continuous in the column direction and a second circuit connected to the plurality of remaining gate lines continuous in the column direction,
   the first circuit provides one of the first control signal and the second control signal to a corresponding gate line, and the second circuit provides another of the first control signal and the second control signal to a corresponding gate line,
   in each of the pixels,
      when an image signal is provided to the corresponding source line and the pixel switch is switched to the ON state based on the first control signal, the image signal is written in the gate electrode via the corresponding source line and the pixel switch and is held in the storage capacitor, and an amount of current flowing through the drive transistor is adjusted, and
      when a reset signal is provided to the corresponding source line and the pixel switch is maintained in the OFF state based on the second control signal, the storage capacitor maintains a state of holding the image signal, and the amount of current flowing through the drive transistor is maintained,
   during a first period of one horizontal scanning period, the second circuit is configured to:
      in each of the pixels in a k-th row, switch the pixel switch to the ON state based on the first control signal, and cause the image signal to be written in the gate electrode and be held in the storage capacitor; and
      in each of the pixels in corresponding remaining rows, maintain the pixel switch in the OFF state based on the first control signal, and
   the first circuit is configured to maintain the pixel switch in the OFF state based on the second control signal in all of the corresponding plurality of pixels, and during a second period following the first period of the one horizontal scanning period,
      the second circuit is configured to maintain the pixel switch in the OFF state based on the first control signal in all of the corresponding plurality of pixels, and the first circuit is configured to maintain the pixel switch in the OFF state based on the second control signal in all of the corresponding plurality of pixels.

2. The display device according to claim 1, wherein the reset line is the first power supply line.

3. The display device according to claim 2, wherein the drive transistor is a P-channel transistor, and includes a source electrode connected to the first power supply line and a drain electrode connected to the light emitting element,
the light emitting element is connected between the drain electrode and the second power supply line,
the second power supply line is held at a constant potential,
the first power supply line is held at a constant potential higher than the constant potential of the second power supply line, and
the storage capacitor is connected between the gate electrode and the source electrode.

4. The display device according to claim 1, wherein the light emitting element is a micro light emitting diode.

5. A display device comprising:
a first power supply line;
a second power supply line;
a reset line;
a plurality of pixels arranged in a row direction and a column direction;
a plurality of gate lines, each of the gate lines being shared by the plurality of pixels arranged in the row direction;
a plurality of source lines, each of the source lines being shared by the plurality of pixels arranged in the column direction; and
a first driver that provides a first control signal and a second control signal to the plurality of gate lines,
wherein
each of the pixels includes:
a drive transistor and a light emitting element connected in series between the first power supply line and the second power supply line;
a pixel switch connected between a corresponding source line among the plurality of source lines and a gate electrode of the drive transistor, the pixel switch being switched between an ON state and an OFF state by the first control signal or the second control signal provided via a corresponding gate line among the plurality of gate lines; and
a storage capacitor connected to the gate electrode,
the first driver includes a first circuit connected to the plurality of gate lines continuous in the column direction and a second circuit connected to the plurality of remaining gate lines continuous in the column direction,
the first circuit provides one of the first control signal and the second control signal to a corresponding gate line, and the second circuit provides another of the first control signal and the second control signal to a corresponding gate line,
in each of the pixels,
when an image signal is provided to the corresponding source line and the pixel switch is switched to the ON state based on the first control signal, the image signal is written in the gate electrode via the corresponding source line and the pixel switch and is held in the storage capacitor, and an amount of current flowing through the drive transistor is adjusted, and
when a reset signal is provided to the corresponding source line and the pixel switch is switched to the ON state based on the second control signal, a potential of the gate electrode and an amount of charge of the storage capacitor are reset by the reset signal provided via the source line and the pixel switch, and the drive transistor does not cause a current to flow,
during a first period of one horizontal scanning period, the second circuit is configured to:
in each of the pixels in a j-th row, switch the pixel switch to the ON state based on the first control signal, and cause the image signal to be written in the gate electrode and be held in the storage capacitor; and
in each of the pixels in corresponding remaining rows, maintain the pixel switch in the OFF state based on the first control signal, and
the first circuit is configured to maintain the pixel switch in the OFF state based on the second control signal in all of the corresponding plurality of pixels,
during a second period following the first period of the one horizontal scanning period,
the second circuit is configured to maintain the pixel switch in the OFF state based on the first control signal in all of the corresponding plurality of pixels, and
the first circuit is configured to:
in each of the pixels in an h-th row, switch the pixel switch to the ON state based on the second control signal, reset a potential of the gate electrode and an amount of charge of the storage capacitor, and the drive transistor does not cause a current to flow; and
in each of the pixels in corresponding remaining rows, maintain the pixel switch in the OFF state based on the second control signal.

6. The display device according to claim 5, wherein the reset line is the first power supply line.

7. The display device according to claim 6, wherein
the drive transistor is a P-channel transistor, and includes a source electrode connected to the first power supply line and a drain electrode connected to the light emitting element,
the light emitting element is connected between the drain electrode and the second power supply line,
the second power supply line is held at a constant potential,
the first power supply line is held at a constant potential higher than the constant potential of the second power supply line, and
the storage capacitor is connected between the gate electrode and the source electrode.

8. The display device according to claim 5, wherein the light emitting element is a micro light emitting diode.

* * * * *